(12) United States Patent
Ford et al.

(10) Patent No.: US 9,299,932 B2
(45) Date of Patent: Mar. 29, 2016

(54) SOLID-STATE ASSEMBLY OF LAYERS AND AN ELECTRIC DEVICE COMPRISING SUCH ASSEMBLY

(71) Applicant: Sony Corporation, Tokyo (JP)

(72) Inventors: William Ford, Stuttgart (DE); Deqing Gao, Stuttgart (DE); Florian Von Wrochem, Stuttgart (DE); Garbiele Nelles, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 13/725,055

(22) Filed: Dec. 21, 2012

(65) Prior Publication Data

US 2013/0175513 A1     Jul. 11, 2013

(30) Foreign Application Priority Data

Dec. 28, 2011 (EP) ..................................... 11195943

(51) Int. Cl.
  *H01L 29/08*      (2006.01)
  *H01L 35/24*      (2006.01)
  *H01L 51/00*      (2006.01)
  *B32B 27/28*      (2006.01)
  *H01L 51/05*      (2006.01)
  *C08G 73/02*      (2006.01)

(52) U.S. Cl.
  CPC ............ *H01L 51/0035* (2013.01); *B32B 27/28* (2013.01); *C08G 73/0266* (2013.01); *H01L 51/0591* (2013.01); *H01L 51/0545* (2013.01); *Y10T 428/31855* (2015.04)

(58) Field of Classification Search
  CPC .......... H01L 51/00; H01L 29/08; H01L 35/24
  USPC .................. 257/40; 428/195.1, 419, 704
  See application file for complete search history.

(56) References Cited

U.S. PATENT DOCUMENTS

| 4,855,361 | A | * | 8/1989 | Yaniger | ................... | C08L 79/02 |
| | | | | | | 252/500 |
| 5,225,495 | A | * | 7/1993 | Han | ....................... | H01B 1/128 |
| | | | | | | 427/121 |
| 5,232,631 | A | * | 8/1993 | Cao | ....................... | C08G 73/02 |
| | | | | | | 252/500 |
| 5,346,780 | A | | 9/1994 | Suzuki | | |
| 5,798,170 | A | * | 8/1998 | Zhang | ................. | H01L 51/0035 |
| | | | | | | 257/103 |
| 6,310,231 | B1 | * | 10/2001 | Igarashi | ................ | C07F 7/0814 |
| | | | | | | 313/504 |

(Continued)

FOREIGN PATENT DOCUMENTS

| JP | 2006080530 | 3/2006 |
| KR | 20080055408 | 6/2008 |
| KR | 20080087623 | 6/2008 |

OTHER PUBLICATIONS

Coucouvanis et al., Square-Planar Sulfur Complexes. VI.1a Reactions of Bases with Xanthates, Dithiocarbamates, and Dithiolates of Nickel(II), vol. 6, No. 11, Nov. 1967.*

(Continued)

*Primary Examiner* — Kevin Parendo
*Assistant Examiner* — Ismail Muse
(74) *Attorney, Agent, or Firm* — Oblon, McClelland, Maier & Neustadt, L.L.P.

(57) ABSTRACT

The present invention relates to a solid-state assembly of layers and to an electric solid-state device comprising such assembly. In one aspect, such electric device is a field effect transistor. In another aspect, such device is a memory device. In yet a further aspect, the device is a sensor device.

30 Claims, 31 Drawing Sheets

(56) References Cited

U.S. PATENT DOCUMENTS

| | | | |
|---|---|---|---|
| 2001/0037947 A1* | 11/2001 | Wei | C07C 209/52 205/431 |
| 2005/0072971 A1* | 4/2005 | Marrocco | B82Y 30/00 257/40 |
| 2005/0184306 A1* | 8/2005 | Parker | H01L 51/5206 257/99 |
| 2005/0236969 A1* | 10/2005 | Seo | H01L 51/5088 313/500 |
| 2007/0132371 A1* | 6/2007 | Liu | G02F 1/15 313/504 |
| 2007/0187672 A1* | 8/2007 | Ono | C09D 179/02 257/40 |
| 2007/0243416 A1* | 10/2007 | Watanabe | C07D 241/42 428/704 |
| 2007/0272920 A1* | 11/2007 | Kathirgamanathan | C07F 15/0033 257/40 |
| 2008/0145669 A1* | 6/2008 | Ye et al. | C08F 226/02 428/419 |
| 2008/0318157 A1* | 12/2008 | Afzali-Ardankani | B82Y 10/00 430/270.1 |
| 2009/0152531 A1* | 6/2009 | Towns | C08G 61/02 257/40 |
| 2009/0200933 A1* | 8/2009 | Smith | C07C 211/58 313/504 |
| 2009/0227765 A1* | 9/2009 | Towns | C08G 73/02 528/422 |
| 2009/0239045 A1* | 9/2009 | Kato | C09D 5/24 428/195.1 |
| 2010/0148165 A1* | 6/2010 | Ushikubo | H01L 51/006 257/40 |
| 2011/0094582 A1* | 4/2011 | Willner | B82Y 30/00 136/256 |
| 2011/0114927 A1* | 5/2011 | Obana | H01L 27/3211 257/40 |
| 2011/0240556 A1* | 10/2011 | Hoek | B01D 67/0011 210/650 |
| 2011/0248247 A1* | 10/2011 | Matsumoto | C09K 11/06 257/40 |
| 2012/0049168 A1* | 3/2012 | Inbasekaran | H01L 51/5056 257/40 |
| 2012/0183676 A1* | 7/2012 | Sonoda | C23C 14/042 427/8 |
| 2012/0305075 A1 | 12/2012 | Ford et al. | |

OTHER PUBLICATIONS

Magdalena et al, Covalently and ionically immobilised monomers on the gold surface, Dec. 12, 2002, Synthetic Metals 140 (2004) 29-35.*

S. M. Sze, et al., "Physics of Semiconductor Devices", Third Edition, Wiley-Interscience, 2007, pp. 271-275.

A.J. Epstein, et al.; "Insulator-To-Metal Transition in Polyaniline"; Synthetic Metals, 18; pp. 303-309; 1987.

Henry S. White, et al; "Chemical Derivatives of an Array of Three Gold Microelectrodes with Polypyrrole: Fabrication of a Molecule-Based Transistor"; J. Am. Chem. Soc., 106; pp. 5375-5377; 1984.

Gregg P. Kittlesen, et al.; "Chemical Derivatization of Microelectrode Arrays by Oxidation of pyrrole and N-Methylpyrrole: Fabrication of Molecule-Based Electronic Devices"; J. Am. Chem. Soc., 106; pp. 7389-7396; 1984.

Elizabeth W. Paul, et al.; "Resistance of Polyaniline Films as a Function of Electrochemical Potential and the Fabrication of Polyaniline-Based Microelectronic Devices"; J. Phys. Chem.; 89; pp. 1441-1447; 1985.

Elizabeth Paul Lofton et al.; "Amplification of Electrical Signals with Molecule-Based Transistors: Power Amplification up to a Kilohertz Frequency and Factors Limiting Higher Frequency Operation"; J. Phys. Chem., 90; pp. 6080-6083; 1986.

E. Tracy Turner Jones, et al.; Preparation of Characterization of Molecule-Based Transistors with a 50-nm Source-Drain Separation with use of Shadow Deposition Techniques: Toward Faster, More SEnsitive Molecule-Based Devices; J. Am. Chem. Soc., 109; pp. 5526-5528; 1987.

Thomas E. Decoursey; "Voltage-Gated Proton Channels and other Proton Transfer Pathways"; Physiol. Rev., 83; pp. 475-579; 2003.

R.A. B. Devine; "Electric-field dependence of mobile proton-induced switching in protonated gate oxide field-effect transistors"; Applied Physics Letters; vol. 77, No. 12; Sep. 18, 2000.

Eleftherios Kapetanakis; et al.; "Molecular Storage Elements for Proton Memory Devices"; Adv. Mater., 20; pp. 4568-4574; 2008.

Dan Li, et al.; "Polyaniline Nanofibers: A Unique Polymer Nanostructure for Versatile Applications"; Accounts of Chemical Research, vol. 42, No. 1; pp. 135-145; Jan. 2009.

Radislav A. Potyrailo, et al.; "Development of radio-frequency identification sensors based on organic electronic sensing materials for selective detection of toxic vapors"; Journal of Applied Physics, 106, 124902-1-124902-6; 2009.

Lintao Cal, et al. "Reversible Bistable Switching in Nanoscale Thiol-Substituted Oligoaniline Molecular Junctions", Nano Letters, American Chemical Society, vol. 5, No. 12, pp. 2365-2372. (2005).

Fan Chen, et al. "A Molecular Switch Based on Potential-Induced Changes of Oxidation State", Nano Letters, American Chemical, vol. 5, No. 3, pp. 503-506. (2005).

W. J. Zang, et al. "Synthesis of Oligomeric Anilines", Synthetic Metals 84, pp. 119-120. (1997).

* cited by examiner

| Reactive component of polymer |
|---|
| Maleic anhydride |
| Methacrylic acid |
| Epoxide |
| Aldehyde |

SOLID-STATE ASSEMBLY OF LAYERS AND AN ELECTRIC DEVICE COMPRISING SUCH ASSEMBLY

CROSS REFERENCE

The present application claims priority of EP patent application 11 195 943.3 filed in the European Patent Office on Dec. 28, 2011, the entire content of which being incorporated herein by reference.

FIELD OF THE DISCLOSURE

The present disclosure relates to a solid-state assembly of layers and to an electric solid-state device comprising such assembly. In one aspect, such electric device is a field effect transistor. In another aspect, such device is a memory device. In yet a further aspect, the device is a sensor device.

BACKGROUND OF THE DISCLOSURE

The ability to switch the electrical conductivity of organic polymers such as polythiophene, polypyrrole, and polyaniline between states of higher (ON state) and lower (OFF state) conductance has spurred research into the use of these materials as active components in a variety of devices, including transistors, memories, and sensors. Polyaniline is unique amongst the common conducting polymers because switching between the ON and OFF states can be achieved by protonation-deprotonation as well as by the more common oxidation-reduction mechanism. Thus, conversion of the neutral, emeraldine base (EB) of PANT into its positively charged, emeraldine salt (ES) form is accompanied by a nine to ten order of magnitude increase in conductivity (A. G. MacDiamid (2001) Angew. Chem. Int. Ed. 40, 2581-2590: """Synthetic metals": A novel role for organic polymers (Nobel Lecture)").

Conducting polymers have been used in microelectrochemical devices, which are electronic devices using adjacent microelectrodes connected with polymer that mimic the fundamental characteristics of the analogous solid-state devices. The first microelectrochemical device having properties analogous to a solid-state field effect transistor was described by Wrighton et al. in 1984 (H. S. White, G. P. Kittlesen, M. S. Wrighton (1984) J. Am. Chem. Soc. 106, 5375-5377: "Chemical derivatization of an array of three gold microelectrodes with polypyrrole: Fabrication of a molecule-based transistor"; G. P. Kittlesen, H. S. White, M. S. Wrighton (1984) J. Am. Chem. Soc. 106, 7389-7396: "Chemical derivatization of microelectrode arrays by oxidation of pyrrole and N-methylpyrrole: Fabrication of molecule-based electronic devices"). The following year, Wrighton et al. demonstrated polyaniline-based devices with diode-like and transistor-like properties wherein a large change ($>10^6$) in electronic conductivity of polyaniline with change in electrochemical potential was the basis of the electronic device function (E. W. Paul, A. J. Ricco, M. S. Wrighton (1985) J. Phys. Chem. 89, 1441-1447: "Resistance of polyaniline films as a function of electrochemical potential and the fabrication of polyaniline-based microelectronic devices"). Despite their simplicity and low cost, microelectrochemical devices have not been very successful commercially except for analytical applications such as chemical or biological sensing. The main disadvantage of microelectrochemical devices compared to their solid-state counterparts is their slower speed of operation. Microelectrochemical transistors are intrinsically slower than solid-state transistors because switching requires the diffusion of ions rather than electrons. Thus, polyaniline-based transistors with ~1.2 μm channel length and polymer film thickness of the order of a few micrometers could amplify electrical signals up to $10^2$-$10^3$ Hz (E. P. Lofton, J. W. Thackeray, M. S. Wrighton (1986) J. Phys. Chem. 90, 6080-6083: "Amplification of electrical signals with molecule-based transistors: Power amplification up to a kilohertz frequency and factors limiting higher frequency operation"], while a reduction in channel length to 0.05-0.1 μm provided transistors that were operational up to ~$10^4$ Hz (E. T. T. Jones, O. M. Chyan, M. S. Wrighton (1987) J. Am. Chem. Soc. 109, 5526-5528: "Preparation and characterization of molecule-based transistors with a 50-nm source-drain separation with use of shadow deposition techniques: Toward faster, more sensitive molecule-based devices"). In contrast, solid-state bipolar transistors are readily capable of switching at frequencies>$10^9$ Hz (S. M. Sze, K. K. Ng (2007) Physics of Semiconductor Devices, Wiley-Interscience).

In recent years, electrically rewritable memory cells that operate on the basis of the displacement of mobile dopant ions in polymeric semiconductors under an applied electric field were developed. Terms such as "dopant-configurable", "electrochemical doping", and "dynamic doping" have been used to describe such devices. Smits et al. first described a system comprising polythiophene as the polymeric semiconductor and lithium triflate as the source of mobile ions (J. H. A. Smits, S. C. J. Meskers, R. A. J. Janssen, A. W. Marsman, D. M. de Leeuw (2005) Adv. Mater. 17, 1169-1173: "Electrically rewritable memory cells from poly(3-hexylthiophene) Schottky diodes"). Later, the same group described a system comprising a block copolymer of thiophene oligomer and poly(ethylene oxide) as the polymeric semiconductor and sodium chloride as the source of mobile ions (F. Verbakal, S. C. J. Meskers, R. A. J. Janssen (2006) Chem. Mater. 18, 2707-2712: "Electronic memory effects in a sexithiophene-poly(ethylene oxide) block copolymer doped with NaCl. Combined diode and resistive switching behavior"). In that same year, Patil et al. reported two systems comprising a substituted poly-p-phenylene vinylene compound as the polymeric semiconductor and either $RbAg_4I_5$ (a solid inorganic electrolyte) or the platinum salts of triflate or hexafluorophosphate as the source of mobile ions (S. Patil, Q. Lai, F. Marchioni, M. Jung, Z. Zhu, Y. Chen, F. Wudl (2006) J. Mater. Chem. 16, 4160-4164: "Dopant-configurable polymeric materials for electrically switchable devices"). Although such devices are potential candidates for non-volatile memory and configurable logic applications, none of them are used as such commercially. One limitation is slow operation speed due to the fact that the mobile dopant ions are relatively large and the devices rely on migration of anions as well as cations. This limitation can be avoided or minimized by using protons as the sole mobile dopant ion.

Due to the sensitivity of its conductivity to protons, polyaniline has been used as a component of chemical and biochemical sensors that detect analytes by changes in film resistance ("chemiresistors"). However, films of polyaniline prepared by the usual solution methods or by electropolymerization generally suffer from slow response times and/or difficulty in achieving reproducible results. Methods have been developed to try to circumvent these shortcomings, such as the use of polyaniline "nanofibers" (D. Li, J. Huang, R. B. Kaner (2009) Acc. Chem. Res. 42, 135-145: "Polyaniline nanofibers: A unique polymer nanostructure for versatile applications"), but these methods involve additional steps. Furthermore, the films thus obtained are usually already acid-doped, so that de-doping is required if the sensor is intended to detect acids or acid-forming compounds. The antennae of RFID tags have also been coated with polyaniline to provide a new type of sensing device, but the polyaniline was acid-doped (R. A. Potyrailo, C. Surman, S. Go, Y. Lee, T. Sivavec, W. G. Morris (2007) J. Appl. Phys. 106, 124902: "Development of radio-frequency identification sensors based on organic electronic sensing materials for selective detection of toxic vapors").

Accordingly, there is a need in the art to improve the polyaniline-based devices.

SUMMARY OF THE INVENTION

It was therefore an object of the present disclosure to provide for means to improve electronic devices which are based on the electrical conductivity of organic polymers. More specifically, it was an object of the present disclosure to provide for means to improve electronic devices based on the electrical conductivity of polyaniline.

The objects of the present disclosure are solved by a solid-state assembly of layers comprising
 a thin film comprising aniline oligomers and,
 a thin film comprising a proton donating material or a proton accepting material,
wherein said thin films are arranged in a stacked manner.

In one embodiment, said aniline oligomers are aniline n-mers, wherein n is in the range of from n=2 to n=21, preferably n=2, 3, 4, 5, 6, 7, 8, 9, 10, 11, 12, 13, 14, 15, 16, 17, 18, 19, 20, or 21.

DETAILED DESCRIPTION

Figure 1:
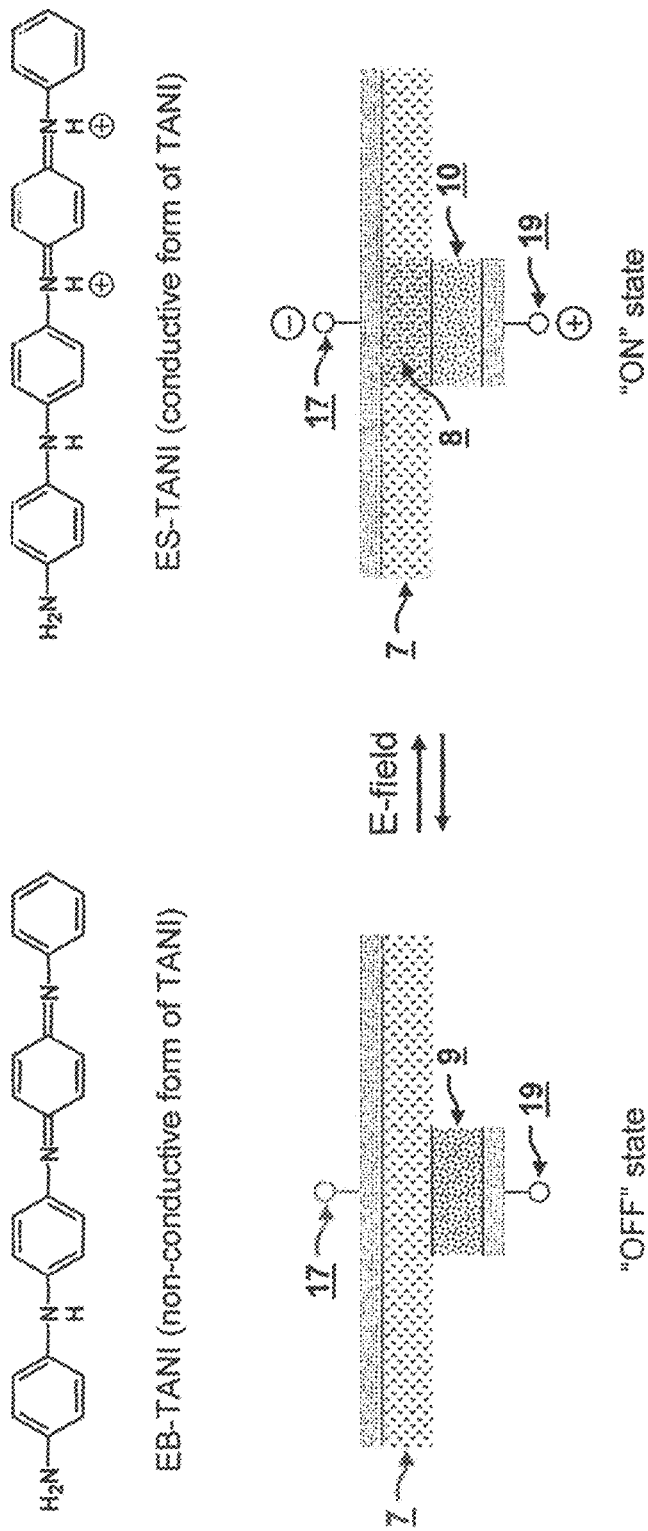
FIG. 1 SHOWS an a crossbar (cross-point) switch memory device and the aniline tetramer (tetraaniline).

In one embodiment, said aniline oligomers are in the emeraldine base (EB) form or in the emeraldine salt (ES) form.

In one embodiment, said aniline n-mers are oligomers comprising aniline monomers in which
a) a hydrogen atom in an ortho-position with respect to the amine group of said aniline monomer,
and/or
b) a hydrogen atom in a meta-position with respect to the amine group of said aniline monomer,
is replaced by another atom or group of atoms, preferably a halogen atom, an alkyl group, or an alkoxy group, and/or in which
c) one or both of the hydrogen atoms attached to a terminal nitrogen atom of said aniline oligomers is/are replaced by another atom or group of atoms, preferably by a phenyl group, or by a anchoring group by which said aniline oligomers can be or are covalently attached to an electrode surface, e.g. a metal surface or a surface of a conducting metal oxide, wherein, preferably, said anchoring group is selected from dithiocarbamate, thiol, phosphonic acid, carboxylic acid, and silanol.

In one embodiment, said thin film comprises said aniline oligomers having a thickness in the range of from 1 nm to 500 nm, preferably 1 nm to 200 nm, more preferably 1-100 nm.

In one embodiment, said aniline oligomers are blended with a polymer which is not polyaniline or does not comprise polyaniline.

In one embodiment, said aniline oligomers are covalently attached to said polymer, preferably via a covalent reaction between the terminal amine groups of said aniline oligomers and functional groups of said polymer, such as anhydride groups, epoxide groups, aldehyde groups and/or carboxylic acid groups.

In one embodiment, said thin film comprising a proton donating material or a proton accepting material has a thickness in the range of from 1 nm to 10 μm, preferably 1 nm to 500 nm, more preferably 1 nm to 200 nm, even more preferably 1 nm to 100 nm.

In one embodiment, said proton donating material is selected from acidic materials comprising one or several functional groups having at least one $pK_a$ value in an aqueous medium in the range of from −1 to 7, preferably in the range of from 1 to 5; said functional groups more preferably being selected from azole groups, phosphonic acid groups, phosphoric acid groups, carboxylic acid groups, phenol groups, sulfonic acid groups, sulfonamide groups, and sulfonamide groups; or said proton donating material is a blend of at least one of said acidic materials with non-acidic materials; or said proton donating material is a layer-by-layer assembly of at least one of said acidic materials with non-acidic materials.

In one embodiment, said proton accepting material is selected from basic materials comprising one or several functional groups having at least one $pK_a$-value in an aqueous medium in the range of from 2 to 10, preferably in the range of from 4 to 8; said functional groups more preferably being selected from: azole groups, amino groups, and pyridine groups; or said proton accepting material is a blend of at least one of said basic materials with non-basic materials; or said proton accepting material is a layer-by-layer-assembly of at least one of said basic materials with non-basic materials.

In one embodiment, said proton donating material or proton accepting material is combined with a material comprising one or more functional groups having pKa values in an aqueous medium that are outside the range of from −1 to 10; such as alcohol (—OH) groups, ether (—O—) groups, ester (—C(=O)O—) groups, amide (—C(=O)NH—) groups, urethane (—OC(=O)NH—) groups, and urea (—NHC(=O)NH—) groups.

In one embodiment, said proton donating material and/or said proton accepting material and/or said material comprising one or more functional groups having pKa values outside the range of from −1 to 10, is a polymer or a blend of several polymers, and said functional groups form part of a backbone or of sidechain(s) of said polymer(s).

In one embodiment, said assembly additionally comprises an electrically insulating substrate adjacent to said assembly.

The objects of the present disclosure are also solved by an electric solid-state device comprising the assembly according to the present disclosure, wherein preferably said electric solid-state device is a field effect transistor, a memory device or a sensor.

In one embodiment, said device is
a) a field effect transistor, comprising:
a drain electrode and a source electrode in contact with said thin film comprising aniline oligomers, and a gate electrode being in contact with said thin film comprising a proton donating material or a proton accepting material or being at an interface between said thin film comprising aniline oligomers and said thin film comprising proton donating or proton accepting material,
said thin film comprising aniline oligomers being in contact with said thin film comprising a proton donating or proton accepting material and thus forming said interface, and, said field effect transistor
optionally, comprising a counter electrode located opposite said gate electrode and being in contact with said thin film comprising aniline oligomers,
or said device is
b) a memory device comprising:
a top electrode in contact with one thin film of said assembly of layers, and
a bottom electrode in contact with an opposite thin film of said assembly of layers, wherein said one thin film is said thin film comprising aniline oligomers and said opposite thin film is said thin film comprising a proton donating or proton accepting material, said two thin films being in contact with each other, or
said device is
c) a sensor device comprising
a source electrode and a drain electrode in contact with said thin film comprising aniline oligomers, and
wherein said thin film comprising a proton donating or proton accepting material is a thin film comprising a proton generating enzyme or a proton consuming enzyme, wherein said thin film comprising said proton generating enzyme or said proton consuming enzyme is in contact with said thin film comprising aniline oligomers,
or said device is
d) a sensor device, comprising
a radio frequency antenna in contact with said thin film comprising aniline oligomers and wherein said thin film comprising a proton accepting or proton donating material is a thin film comprising a proton generating enzyme or a proton consuming enzyme, wherein said thin film comprising said proton generating enzyme or said proton consuming enzyme is in contact with said thin film comprising aniline oligomers.

In embodiments of the electric device being a field effect transistor, one or several electrically insulating layers may be inserted between the various components. For example, in one embodiment, an electrically insulating layer is inserted between an electrode, e.g. a gate electrode, and said thin film comprising a proton donating or accepting material. In one embodiment, an electrically insulating layer is inserted between an electrode, e.g. counter electrode, and said thin film comprising aniline oligomers. In one embodiment, the afore-mentioned electrically insulating layer(s) comprises (comprise) a self-assembled monolayer (SAM) chemisorbed to a surface of said electrode(s). In one embodiment, said electrically insulating layer(s) comprises (comprise) a monolayer of poly(vinylalcohol) adsorbed to a surface of said electrode(s).

In embodiments of the electric device being a memory device, one or several electrically insulating layers may be inserted between the various components. For example, in one embodiment, an electrically insulating layer is inserted between an electrode, e.g. a top electrode, and said one thin film of said assembly. In one embodiment, an electrically insulating layer is inserted between an electrode, e.g. a bottom electrode, and said opposite thin film of said assembly. In one embodiment, said electrically insulating layer(s) comprises (comprise) a self-assembled monolayer (SAM) chemisorbed to a surface of said electrode(s). In one embodiment, said electrically insulating layer(s) comprises (comprise) a monolayer of poly(vinylalcohol) adsorbed to a surface of said electrode(s).

In embodiments of the electric device being a sensor device, one or several electrically insulating layers may be inserted between the various components. For example, in one embodiment, an electrically insulating layer is inserted between electrodes, e.g. said drain and source electrodes, and said thin film comprising said aniline oligomers. In one embodiment, several electrically insulating layers are inserted between electrodes, e.g. said drain and source electrodes, and said thin film comprising aniline oligomers. In one embodiment, said electrically insulating layer(s) comprises (comprise) self-assembled monolayers (SAM) chemisorbed to a surface or surfaces of said electrode(s). In one embodiment, said electrically insulating layer(s) comprises (comprise) monolayers of poly(vinylalcohol) adsorbed to one or several surfaces of said electrodes. In one embodiment, an electrically insulating layer is inserted between said radio frequency antenna and said thin film comprising aniline oligomers. In one embodiment, said electrically insulating layer(s) comprises (comprise) a self-assembled monolayer (SAM) chemisorbed to a surface of said radio frequency antenna. In one embodiment, said electrically insulating layer(s) comprises (comprise) a monolayer of poly(vinylalcohol) adsorbed to a surface of said radio frequency antenna. In one embodiment, the sensor may be a sensor for chemicals, such as $CO_2$, protons, etc., or it may be a sensor for measuring physical promoters, such as temperature or humidity.

In one embodiment of said assembly of layers, said thin film comprising aniline oligomers is a thin film comprising aniline oligomers in the emeraldine base (EB) form, and said thin film comprising a proton donating or accepting material is a thin film comprising proton donating material; or said thin film comprising aniline oligomers is a thin film comprising aniline oligomers in the emeraldine salt (ES) form and said thin film comprising a proton donating or accepting material is a thin film comprising a proton accepting material.

In those embodiments of the device(s) according to the present disclosure wherein one or several insulating layers are present, such insulating layer(s) has (have) a thickness in the range of from 1 nm to 20 nm, preferably 1 nm to 10 nm, more preferably 1 nm to 5 nm. In one embodiment, the insulating layer(s) is (are) located between the switching layer and an electrode, or between the switching layer and a radiofrequency antenna, or between the layer of proton donating or accepting material and an electrode, or between the layer of proton donating or accepting material and a radio frequency antenna.

The term "a solid-state", when used herein in conjunction with an assembly of layers or an electronic device is meant to refer to an assembly of layers or device that is entirely based on solid materials. In such assembly of layers and devices, the electrons and other charge carriers, if present, are confined entirely to within the solid materials from which the assembly of layers or the device is made. The term also implies that there are no moving parts within the assembly and device. Furthermore, in one embodiment, the term also excludes the presence of liquids, such as solutions of electrolytes within the assembly or the device. In one embodiment, the term does include, however, "semi-solid" assemblies or devices. In such an embodiment gels or gel-like components may be present in said assembly or device.

The term "assembly of layers" is meant to refer to an arrangement of at least two layers or films, e.g. thin films, which are typically on top of one another or are at least partially overlapping with each other, or are placed in a side-by-side manner, with the longitudinal direction of the layers being vertical. In the latter case, the layers are arranged in a vertical stack, whereas in the first case, the layers are arranged in a horizontal stack. The term "assembly of layers" as used herein is meant to refer to at least two layers being present in such assembly, but it also includes three, four, five or more layers being present in such assembly. In one embodiment of such assembly of layers, there is a plurality of layers present therein. For example, in addition to a layer of aniline oligomers and a layer of proton donating or accepting material, there may also be present one or several electrically insulating layers at the interface between the layer of aniline oligomers and the layer of proton donating or accepting material. Additionally, there may also be present one or several insulating layers at the interface of any of the afore-mentioned layer of aniline oligomers and layer of proton donating or accepting material and an electrode, if present.

The term "arranged in a stacked manner", when used in conjunction with "layers", is meant to refer to an arrangement, where these layers are either put on top of each other (if the layers are arranged in a horizontal manner, i.e. their longitudinal direction extends in a horizontal manner), or they are arranged in a side-by-side-fashion, if the layers are arranged in a vertical manner. In the latter case, they are arranged just like the pages of a book that is standing on a shelf.

The term "emeraldine base", when used herein in conjunction with polyaniline or oligoaniline is meant to refer to an aniline polymer or oligomers, wherein a proportion of the N-linking groups are amine links and another proportion are imine links. If the imine links are then protonated by an acid, this form is referred to as "emeraldine salt".

The term "oligoaniline" or "aniline oligomer" is meant to refer to an oligomer having n aniline monomers, wherein n is in the range from 2 to 21, i.e. 2, 3, 4, 5, 6, 7, 8, 9, 10, 11, 12, 13, 14, 15, 16, 17, 18, 19, 20, 21.

The term "anchoring group", as used herein, is meant to refer to any functional group that allows the covalent attachment of an aniline oligomer to an electrode surface. Such electrode surface may be a metal surface, or it may be the surface of a conducting oxide, such as indium tin oxide (ITO).

A "phenyl-terminated derivative" of aniline is an aniline oligomer wherein a terminal group is a phenyl. A "methyl-derivative" of an aniline oligomer is an aniline oligomer wherein a part of the amine linking groups are methylated.

The terms "bottom" and "top" when referring to a stack of layers or to electrodes in contact with layers within a stack are used in a structural sense to indicate the order in which such elements are arranged, but these terms are not meant to limit the overall orientation in a device. Thus, for example, a device is considered to be the same whether it is in a vertical or horizontal orientation or even flipped over as long as the elements within it have the same arrangements with respect to one another.

As used herein, the terms "acid" and "base" refer to the Brønsted-Lowry concept, where an acid is a proton (hydrogen ion) donor and a base is a proton (hydrogen ion) acceptor. These terms may refer to molecules or to groups within molecules. The dissolution of an acid in water can be considered according to the equation $AH+H_2O=A^-+H_3O^+$, where $A^-$ is referred as the "conjugate base" and the "=" sign indicates the existence of an equilibrium between the two sides of the equation. Strong acids are ones that ionize completely (or practically so) when dissolved in water, so that the equilibrium strongly favors the right side of the equation. An example of a strong acid is methanesulfonic acid ($CH_3SO_3H$, $pK_a=-1.9$). Weak acids are ones that do not ionize fully when dissolved in water, such as acetic acid ($CH_3COOH$, $pK_a=4.8$), and very weak acids are ones that do not ionize at all (or practically so), such as phenol (PhOH, $pK_a=10.0$). Conversely, the dissolution of a base in water can be considered according to the equation $B+H_2O=BH^++OH^-$, where $BH^+$ is referred as the "conjugate acid". Hydroxide ion ($OH^-$) is the strongest base possible in aqueous solutions. Organic bases are usually neutral, nitrogen-containing species.

Examples of strong, weak, and very weak bases are guanidine ($H_2NC(=NH)NH_2$, $pK_a$=13.6), ammonia ($NH_3$, pKa=9.2), and aniline ($PhNH_2$, $pK_a$=4.6).

The term "acid dissociation constant" ($K_a$) is the equilibrium constant for the dissociation of an acid to form a proton ($H^+$) and reflects the "strength" of the acid. The corresponding $-\log_{10} K_a$ is referred to as the $pK_a$. Mineral acids such as HCl, $H_2SO_4$, and $H_3PO_4$ are strong acids, with $pK_a$ values<0. HCl is referred to as a monoprotic acid because it has a single proton to release, while $H_2SO_4$ and $H_3PO_4$ can release more than one proton and are referred to as polyprotic acids. It is understood that the proton ($H^+$) does not usually exist as a free hydrogen nucleus in solutions or in the solid or semisolid materials of the type described herein, but rather the proton is usually bound to another molecule, such as a water molecule to form the hydronium ion ($H_3O^+$).

The term "alkoxy group" refers to a substitute for a hydrogen atom on a molecule comprising an alkyl group attached by an oxygen atom, having the general formula $OC_nH_{2n+1}$, such as methoxy ($OCH_3$), ethoxy ($OC_2H_5$) and propoxy ($OC_3H_7$).

The term "alkyl group" refers to a substitute for a hydrogen atom on a molecule comprising any one of a group of carbon and hydrogen atoms having the general formula $C_nH_{2n+1}$, such as methyl ($CH_3$), ethyl ($C_2H_5$) and propyl ($C_3H_7$).

The term "amine" (or "amino") refers to a functional group derived from ammonia ($NH_3$) in which one, two, or all three of the hydrogen atoms have been replaced with organic groups, yielding primary, secondary, or tertiary amines, respectively. The group of atoms comprising a nitrogen atom with one or two hydrogen atoms attached is often referred to as an "amino group". When referring to the emeraldine form of an aniline polymer or oligomer, the term "amine link" refers to an amino group —NH— connected to a benzenoid ring. The protonated form of the amino group, —$NH_2^+$—, referred to as an "ammonium group", has an acid dissociation constant $K_a$ of about $10^{-2.5}$ ($pK_a \approx 2.5$).

The term "anchoring group", as used herein, is meant to refer to any functional group that allows the covalent attachment of a molecule to a surface, specifically to covalently attach an aniline oligomer to the surface of an electrode. Such electrode surface may be a metal surface, or it may be the surface of a conducting oxide, such as indium tin oxide (ITO). More generally, the term refers to a functional group enabling covalent coupling ("chemisorption") of a molecule to a surface, which is also sometimes referred to as a "surface anchoring group", "surface connecting group" or "surface binding group". The surface-anchoring group of choice depends on the surface chemistry of the material used as substrate The term "oligoaniline" or "aniline oligomer" or "n-mer" refers to an oligomer whose repeating monomer subunits comprise aniline (or substituted aniline), specifically to an oligomer comprising n aniline subunits, wherein n is preferably in the range from 2 to 21, more preferably where n=2, 3, 4, 5, 6, 7, 8, 9, 10, 11, 12, 13, 14, 15, 16, 17, 18, 19, 20, or 21. These molecules may be terminated with a group that is not aniline such as the phenyl group or an anchoring group. For example, an aniline oligomer comprising four subunits may be referred to as "tetramer" or "4-mer" or "tetraaniline", and such a molecule terminated with a phenyl group may be referred to as "phenyl-terminated tetraaniline", while the molecule terminated with a dithiocarbamate anchoring group may be referred to as tetraaniline dithiocarbamate (TANI-DTC).

The term "azole" refers to a general class of 5-membered heterocyclic organic compounds comprising 1-4 nitrogen atoms in the ring and two double bonds (C=C, C=N, and/or N=N).

The term "benzenoid ring" refers to a benzene-like 6-membered carbon ring containing 3 double bonds.

The term "blend" generally refers to a macroscopically homogeneous mixture of two or more different materials, such as polymers ("polymer blend"). As used herein, this term is also applied to a homogeneous mixture of an aniline oligomer (oligoaniline) with one or more polymers.

The term "conjugate acid" as used herein, is meant to denote an acid formed when a base captures a proton, or a substance formed when a base gains a hydrogen ion, which is considered as an acid because it can lose a hydrogen ion to reform the base.

The term "conjugate base", as used herein, is meant to refer to a base formed when an acid releases a proton, or a substance formed when an acid loses a hydrogen ion, which is considered as a base because it can gain a hydrogen ion to reform the acid.

The term "covalent attachment" (or "covalent bonding" or "covalent coupling") refers to a type of chemical bonding characterized by the sharing of one or more pairs of electrons between atoms, which holds the resultant molecule or assembly together.

The term "doping" when used herein in conjunction with an aniline oligomer (or polymer) generally refers to protonation of the oligomer or a layer comprising the oligomer, the term "dopant" thereby referring to the proton (or hydrogen ion, $H^+$). Protonation of an aniline oligomer causes its energy levels to be rearranged, but the number of electrons associated with the molecule does not change during the protonic doping process, in contrast to the redox doping process. Besides protons, other types of acids can serve as non-redox dopants for aniline oligomers, including Lewis acids such as $BF_3$ and $Li^+$.

The terms "dynamic doping" and "dynamic dedoping" as used herein refers to a response to an external electric field wherein a redistribution of mobile ions (dopants) occurs within a material, resulting in changes in the electrical properties of the material, more specifically to changes in its electrical conductivity. With respect to a switching layer comprising the emeraldine form of an aniline oligomer, "dynamic doping" and "dynamic dedoping" refer to a field-induced increase and decrease in proton concentration within the layer, respectively.

The term "emeraldine" refers to an oxidation state of aniline oligomers (or polymers) wherein the N-linking groups comprise both amine links and imine links. Generally, in cases of n-mers where n is an even integer, the number of amine links is approximately equal to the number of imine links. In cases of n-mers where n is an odd integer, the number of amine links may be greater than the number of imine links, or vice versa. For example, the emeraldine form of the 5-mer can contain either 3 amine links and 2 imine links, or 2 amine links and 3 imine links. The term "emeraldine base" (EB) refers to an aniline polymer or oligomer wherein the N-atoms of the imine links are not protonated, i.e., they are neutrally charged. The term "emeraldine salt" (ES) refers to the polymer or oligomer wherein N-atoms of the imine links are protonated by an acid, i.e., they are positively charged.

The term "equivalent weight" (also known as "gram equivalent") as used herein refers to acid-base reactions is the ratio of the molecular weight of a species donating or receiving protons to the number of protons involved in the reaction.

In other words, it is the mass of a given substance that will supply or react with one mole of protons (H$^+$) in an acid-base reaction.

The term "exchange capacity" as used herein refers to the capacity of the proton source (donating) layer to reversibly release protons. One measure of this capacity is the density (e.g., moles per unit volume) of acidic sites with exchangeable (ionizable) protons in the layer multiplied by the volume of the layer. Alternatively, this term refers to the capacity of the proton sink (accepting) layer to reversibly absorb protons, which is determined by the density of basic sites in the layer.

As used herein, the term "film" (or "thin film") has the same meaning as "layer", i.e. a coating of one material on another one. This coating does not necessarily cover the entire underlying surface and it may also be coated by another material. In one embodiment, a thin film is a layer having a thickness in the range of from 1 nm to 500 nm, preferably 1 nm to 200 nm, more preferably 1 nm to 100 nm. The term "film" may also include an arrangement wherein several layers together form such a film. In this embodiment, such several layers forming a "film" may also be referred to as "sub-layers".

As used herein, the term "gel" (or "gel-like") refers to a colloidal dispersion in which the dispersed phase has combined with the dispersion medium to produce a semisolid material. Generally, the dispersed phase comprises interlinked macromolecules or colloidal particles or combinations thereof. The term "hydrogel" refers to a gel in which the dispersion medium is water, while the term "organogel" refers to a gel in which the dispersion medium is a liquid organic phase.

The term "halogen atom" refers to a substitute for a hydrogen atom on a molecule comprising one of the elements found in group 17 (group VII) of the periodic table, especially to a fluorine (F), chlorine (Cl), bromine (Br), or iodine (I) atom.

The term "imine" (or "imino") refers to a functional group or chemical compound containing a carbon-nitrogen double bond, wherein the nitrogen atom is attached to a hydrogen atom or an organic group. When referring to the emeraldine form of an aniline polymer or oligomer, the term "imine link" refers to an imino group =N— connected to a quinoid ring. The protonated form of the imino group, =NH$^+$—, referred to as an "iminium group", has an acid dissociation constant $K_a$ of about $10^{-5.5}$ (p$K_a$≈5.5). The smaller $K_a$ of the iminium group compared to the ammonium group means that the imine group is more basic and thus is more likely to be protonated by an acid during the conversion of emeraldine base (EB) to emeraldine salt (ES).

The term "isoelectric point" (pI or IEP) refers to the pH at which a particular molecule or surface carries no net electrical charge.

The term "layer" refers to a single thickness of a material overlying (or underlying) a substrate or another layer. The term "assembly of layers" is meant to refer to an arrangement of at least two layers which are typically on top of one another or are at least partially overlapping with each other, or are placed in a side-by-side manner, with the longitudinal direction of the layers being vertical. In the latter case, the layers are arranged in a vertical stack, whereas in the first case, the layers are arranged in a horizontal stack. The term "assembly of layers" as used herein is meant to refer to at least two layers being present in such assembly, but it also includes three, four, five or more layers being present in such assembly. In one embodiment of such assembly of layers, there is a plurality of layers present therein. For example, in addition to a layer of aniline oligomers and a layer of proton donating or accepting material, there may also be present one or several electrically insulating layers at the interface between the layer of aniline oligomers and the layer of proton donating or accepting material. Additionally, there may also be present one or several insulating layers at the interface of any of the afore-mentioned layer of aniline oligomers and layer of proton donating or accepting material and an electrode, if present. The term "layer" is also sometimes used herein synonymously with "film" or "thin film".

The term "Layer-by-Layer (or LbL) deposition" refers a technique in which multilayered thin films are formed by depositing alternating layers of materials with complementary functional groups, usually with wash steps in between. The layers and wash steps can be performed in various ways including dip coating, spin-coating, spray-coating, flow based techniques and inkjet technology. The complementary interaction between functional groups that is most often used is electrostatic (e.g., between oppositely charged polyelectrolytes), but other reversible, non-covalent intermolecular interactions such as hydrogen bonding and host-guest-complex formation can also be employed. Alternatively, interaction between functional groups can involve covalent bond formation resulting in cross-linking of the layers, either during each deposition step or subsequently. Covalent cross-linking can provide greater chemical stability to LbL films compared to those using electrostatic or hydrogen-bonding interactions. Covalent chemical reactions that have been used to cross-link LbL films include diverse reactions such condensation between carboxylic acids (—COOH) and amines (—NH$_2$) to form amides (—CONH—), condensation between amines (—NH$_2$) and aldehydes (—CHO) to form imines (—N=CH—), condensation between isocyanates (—NCO) and amines (—NH$_2$) to form ureas (—NHCONH—), oxidation of thiols (—SH) to form disulfides (—SS—), and cycloaddition between alkynes (—CH), and azides (—N$_3$) to form triazoles (—C$_2$N$_3$—).

In chemistry, an "oligomer" comprises a finite number of repeating monomer subunits, in contrast to a polymer which, at least in principle, consists of an infinite number of subunits.

As used herein, the terms "ortho" and "meta" refer the position of a substituent (an atom or group of atoms) that replaces a hydrogen atom on the aniline ring. If the carbon atoms are numbered 1 to 6, where 1 refers to the carbon attached to the N-atom of the amino group, then a substituent in the ortho position refers to one attached to either carbon atom number 2 or number 6, and a substituent in the meta position refers to one attached to either carbon atom number 3 or 5.

The class of protonic acids known as "oxo acids" (also "oxoacids" or "oxyacids") comprise acidic X—OH groups, where X represents another element, including C (e.g., carboxylic acids, phenols, etc.), P (e.g., phosphonic acids, etc.), and S (e.g., sulfonic acids, etc.) (F. A. Cotton, G. Wilkinson (1972) Advanced Inorganic Chemistry, John Wiley and Sons, p. 170). Compounds obtained by condensing sulfonic acids with ammonia or primary amines, wherein the S—OH group is transformed into an S—NH— group, are also protonic acids, due to the electron withdrawing nature of the two oxygen atoms attached to the S atom.

The term "phenyl group" refers to a substitute for a hydrogen atom on a molecule comprising a benzene ring with one hydrogen atom removed, having the formula —C$_6$H$_5$.

The term "polyelectrolyte" refers to a polymer whose repeating units bear an electrolyte group, which can be either positively charged (cationic) or negatively charged (anionic). Polyelectrolytes which bear both cationic and anionic repeating units are known as "polyampholytes".

As used herein, the term "proton sink layer" or "proton accepting layer" or "layer of proton accepting material" or "thin film comprising proton accepting material" refers to a layer comprising basic sites within or at its surface that can reversibly absorb protons from a switching layer comprising the emeraldine salt (ES) form of an aniline oligomer. Alternatively, the proton sink layer may comprise an enzyme that catalyzes a proton-consuming chemical reaction in the presence of a suitable substrate. Preferably, said basic sites or enzyme are confined to the proton sink layer and are thus unable to diffuse to another layer.

As used herein, the term "proton source layer" or "proton donating layer" or "layer of proton donating material" or "thin film comprising proton donating material" refers to a layer comprising acidic sites within or at its surface that can reversibly release protons to a switching layer comprising the emeraldine base (EB) form of an aniline oligomer. Alternatively, the proton source layer may comprise an enzyme that catalyzes a proton-generating chemical reaction in the presence of a suitable substrate. Preferably, said acidic sites or enzyme are confined to the proton source layer and are thus unable to diffuse to another layer.

In one embodiment, the thickness of the proton source or sink layer (=thin film comprising a proton donating material or proton accepting material) is in the range from 1 nm to 10 μm, preferably 1 nm to 5 μm, more preferably 1 nm to 1 μm, even more preferably 1 nm to 500 nm.

In one embodiment, the thickness of the proton source or sink layer (=thin film comprising a proton donating material or proton accepting material) is in the range from 1 nm to 200 nm, preferably 1 nm to 100 nm.

The term "quinoid ring" refers to a quinone-like a 6-membered carbon ring containing 2 double bonds.

The term "self-assembled monolayer" (or "SAM"), as used herein, is meant to refer to a two-dimensional film comprising an organized or semi-organized molecular layer formed by molecules that adsorb spontaneously onto surfaces. Typically, this molecular assembly is formed by the adsorption of molecules on a solid surface. Generally speaking, the adsorption of molecules at solid surfaces can occur by either chemical or physical bonding. As used herein, chemisorption (chemical adsorption) refers to the formation of bonds of chemical strength (i.e. binding energies per adsorbate in the eV range), whereas physisorption (physical adsorption) refers to unspecific adsorption based on dispersion interaction. As used herein the term "monolayer" refers to a single molecular layer in which the total coverage can vary from approximately 0.7 monolayer to 1 monolayer, depending on the substituents and substrate, as opposed to a "multilayer" in which the total coverage exceeds 1 monolayer. As used herein the term "monolayer" does not distinguish between highly ordered monolayers that have both local and long-range order and less ordered monolayers that are partially organized with an average orientation perpendicular to the surface of the substrate. Ideally, the molecules comprising the self-assembled monolayer are closely packed.

The term "semi-solid" (or "semisolid") refers to a substance having properties such as rigidity that are intermediate between solids and liquids. Such substances typically display gel-like qualities.

The term "solid-state" (or simply "solid") refers to a substance that retains a definite size and shape and resists forces that tend to deform it. When used herein in conjunction with an assembly of layers or an electronic device, the term is meant to refer to an assembly of layers or device that is entirely based on solid materials. In such assembly of layers and devices, the electrons and other charge carriers, if present, are confined entirely to within the solid materials from which the assembly of layers or the device is made. The term also implies that there are no moving parts within the assembly and device. Furthermore, the term also excludes the presence of fluid liquids, such as solutions of electrolytes within the assembly or the device. However, included in the class of "solid materials" are materials known as "semi-solids".

The term "stack" refers to an orderly arrangement of layers. The term "arranged in a stacked manner", when used in conjunction with "layers", is meant to refer to an arrangement, where these layers are either put on top of each other (if the layers are arranged in a horizontal manner, i.e. their longitudinal direction extends in a horizontal manner), or they are arranged in a side-by-side-fashion, if the layers are arranged in a vertical manner. In the latter case, they are arranged just like the pages of a book that is standing on a shelf.

As used herein, the term "switching layer" refers to a layer comprising an aniline oligomer, which may be terminated with a group that is not aniline such as the phenyl group or an anchoring group. Sometimes the term is also used herein synonymously with "thin film comprising aniline oligomers". Preferably, said aniline oligomer comprises its emeraldine base (EB) or emeraldine salt (ES) form, whereby the term "switching" refers to a reversible transition between these two forms and the concomitant change in electrical conductivity of said layer.

As used herein, the term "tautomerization" refers to the reversible exchange of a hydrogen atom between two other atoms in the same molecule, which is accompanied by switching of adjacent single and double bonds. For example, tautomerization between the 1H and 2H forms of 1,2,3-triazole can be represented as:

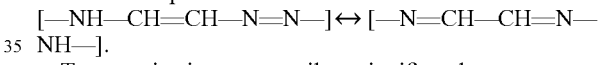

[—NH—CH=CH—N=N—] ↔ [—N=CH—CH=N—NH—].

Tautomerization can contribute significantly to proton conduction in proton donating or proton accepting materials.

The present inventors have surprisingly found that by providing a combination of a layer of aniline oligomers and a layer of a proton donating or accepting material, an arrangement can be established, wherein the oligoaniline can be reversibly switched between a conductive state and an insulating state. In particular, embodiments of the present disclosure provide a solution to the slow response and the lack of practicability of gas or electrochemically-doped aniline materials by providing an intrinsically solid state bilayer architecture in which the solid-state donor is in direct contact with the aniline conductivity-switching layer. In an embodiment, the layer of aniline oligomers is a thin film. The term "thin film", as used herein, is meant to refer to a film or layer having a thickness in the range of from 1 nm to 500 nm, preferably 1-200 nm, more preferably 1-100 nm. In addition, there may be further layers, such as small insulating layers between the afore-mentioned active layers. The switching in the layer of aniline oligomers is achieved by an induced migration of protons into or out of the layer of proton donating or accepting material. Such switching may be electric field induced or may be chemically induced, for example because of the presence of an analyte. If the switching α-curs by electric field induced migration of protons into or out of the layer of proton donating or accepting material, the resulting assembly of layers is particularly useful for use in electronic devices, such as field effect transistors, and memory devices. The field-induced proton diffusion between the two layers results in the aniline oligomers becoming protonated or deprotonated. Furthermore, such protonation/deprotonation may also be accompanied by oxidation/reduction reactions in either of the two layers. The described redox or doping processes are important to obtain bistability in the electrical conductance of the material (corresponding to ON and OFF state), which is relevant for non-volatile memory applications, such as, among others, organic based Flash-memories or EEPROM (Electrically Erasable Programmable Read-Only Memory) memories, as well as passive matrix memory arrays, in which the storage density of the memory is increased just by implementing thin film switchable layers in between the electrodes of a simple crossbar architecture. Such thin-film based switching materials can easily be fabricated on flexible substrates and plastic foils, allowing the application of this kind of memory materials to printed electronics and printed opto-electronics (e.g. in displays). Furthermore, in an organic thin film transistor geometry, gated thin aniline layers can offer a higher source-drain current than what is currently known for organic thin film transistor (OTFT) devices, as in the latter the channel extends over about only 1 nm in thickness, whereas the active layer thickness in aniline based OTFT devices can be significantly increased (i.e. to the thickness of a doped aniline layer). As for organic memories, aniline-based OTFT are applicable to printed electronics, displays, electronic readers (e-paper) and solar cells, as these aniline thin films allow the use on flexible substrates.

In another embodiment, electrical switching in the layer of aniline oligomers occurs by a chemically induced migration of protons into or out of the layer of proton donating or accepting material.

The layer of aniline oligomers and the layer of proton donating or accepting material may be in direct contact with each other, or they may be separated by one or several additional electrically insulating layers, which typically have a thickness<10 nm. Furthermore, the layer of aniline oligomers and/or the layer of proton donating or accepting material may be in direct contact with an electrode or several electrodes, or may be separated from such electrode(s) by an additional thin electrically insulating layer. Such combinations can be used as active elements in electrical devices, such as field effect transistors, random access memories and chemical sensors. Representative examples are shown in the figures. It should be noted that, for simplicity, these diagrams do not include any additional thin electrically insulating layers, which may be placed between the layer of aniline oligomers and the layer of proton donating or accepting material, or between the afore-mentioned layers and the electrodes or substrates to which they are attached. It should also be noted that, for simplicity, in most cases, these diagrams do not include any of the inert substrates upon which the devices may be or are fabricated or supported.

The layers or thin films that function as proton source (9) or proton sink (15 in embodiments of devices according to the present disclosure essentially comprise proton conducting materials, which may be combined with other materials that facilitate proton transport. Solid (or semisolid) proton conductors are a class of electrolytes that are important components of devices such as fuel cells, batteries, and sensors, so a wide variety of such materials are known. For the applications in the present disclosure, several features are necessary or highly desirable. These features include:

1) Layer 9 (or 15) should be thin as possible, while still having the proton donating (or accepting) capacity for switching to occur in layer 7 (or 1);
2) The acidity (or basicity) of the layer should be such that proton transfer from layer 9 to layer 7 (or from layer 13 to layer 15) is insufficient for switching in the absence of an applied electric field;
3) The proton donating (or accepting) groups comprising layer 9 (or 15) should be unable to diffuse into the switching layer 7 (or 13); and
4) Layer 9 (or 15) should be non-conductive or semiconductive towards electrons (or holes).

Figure 8:
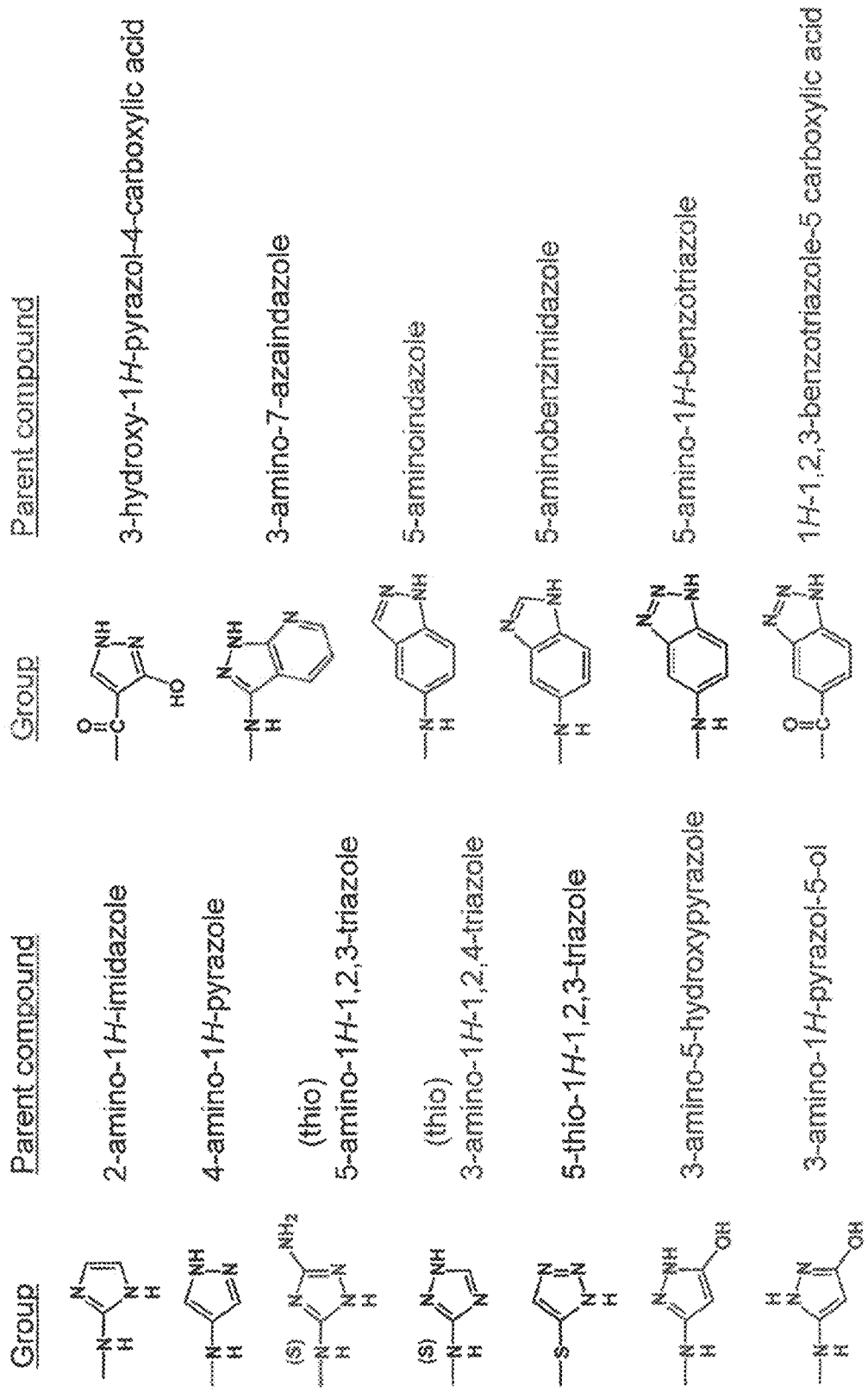
FIG. 8 shows examples of substituents comprising proton donor/acceptor groups using commercially available azoles.

Proton conduction in solid (or semisolid) media usually occurs via the "Grotthuss mechanism" or the "vehicle mechanism", or a combination of the two. In the Grotthuss mechanism (also referred to as "facilitated hopping transport" or "structural diffusion"), a proton (or protonic defect) hops sequentially between sites that are connected by a hydrogen bond network (pathway); a local molecular rearrangement (usually a rotation) is required before another proton can be transported in the same direction. The alternative vehicle mechanism involves the translational diffusion of protons through the medium; since "bare" protons are improbable, the diffusion of another molecule (usually water) associated with the proton is required. Although transport by the Grotthuss mechanism is generally faster than translational diffusion, the required rotation (or "flipping") the molecules, or parts of molecules, involved in the network introduces energy barriers that limit the rate of transport. Azoles comprise heterocyclic nitrogen containing compounds that are often used as proton conducting species because they mimic water with respect to their hydrogen-bonding capabilities, amphoteric character, and ability to undergo self-dissociation ("autoprotolysis"). Such compounds include derivatives of imidazole, pyrazole, triazole, tetrazole, benzimidazole, and benzotriazole. Azoles comprising three or more N-atoms, at least one of which comprises an N—H group, are particularly useful in proton conducting materials; the availability of more than two N-atoms and/or the capability for tautomerization can provide lower barriers to proton transport compared to materials comprising azoles lacking such properties. FIG. 8 shows several examples of commercially available azoles that can be used in the proton source (9) or proton sink (15) layers; as indicated in the figure, the azole groups are covalently attached to an organic residue R, such as a polymer, via amino or carboxylic acid groups. Besides azoles, other groups with hydrogen-bonding capabilities, amphoteric character, and ability to undergo self-dissociation include phosphonic acids, having the general structure R—P($=$O)(OH)$_2$, phosphoric esters having the general structure R—O—P($=$O)(OH)$_2$, phosphonic amides, having the general structure R—P($=$O)(OH)(NHR'), sulfonic acids, having the general structure R—S($=$O)$_2$(OH), sulfonamides, having the general structure R—S($=$O)$_2$(NHR'), and sulfamides, having the general structure R—S($=$O)$_2$(NHR')(NHR"), where R represents an organic residue, such as a polymer, and where R' and R" represents an organic residue or an H atom. Besides the above-mentioned groups, hydroxyl (—OH) groups can also participate in proton conducting networks since they can accept as well as donate protons.

The proton donor/acceptor groups can combined with acids or bases (as "dopants") to provide a greater concentration of mobile protons; they can also be combined with glycol ethers to provide greater mobility.

Incorporating the functional components of the proton source (9) or proton sink (15) layers (e.g., the proton donor/acceptor groups, acidic or basic dopants, glycol ethers, etc.) into one or more kinds of polymers offers several advantages compared to using individual components. These advantages include:

1) Diffusion ("leaching") of the functional components from layer 9 into layer 7 (or from layer 13 into layer 15) is much less likely to occur, especially if the polymer molecules are interlinked;

2) The functional components can be held close together via covalent bonds; and
3) The polymer can provide structural order and/or regularity to the functional components, especially if the repeating units of the polymer comprise one or more of these components.

Figure 9:
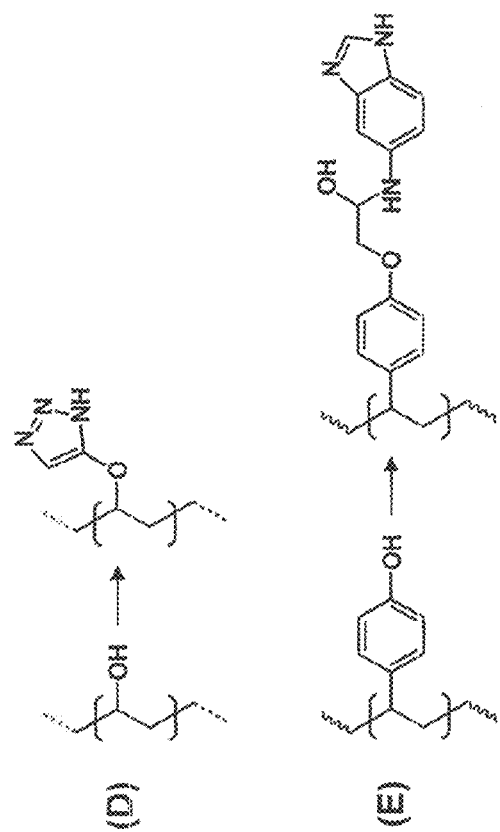
FIG. 9 shows examples of proton donor/acceptor groups covalently attached to pre-existing polymers.
Figure 9:
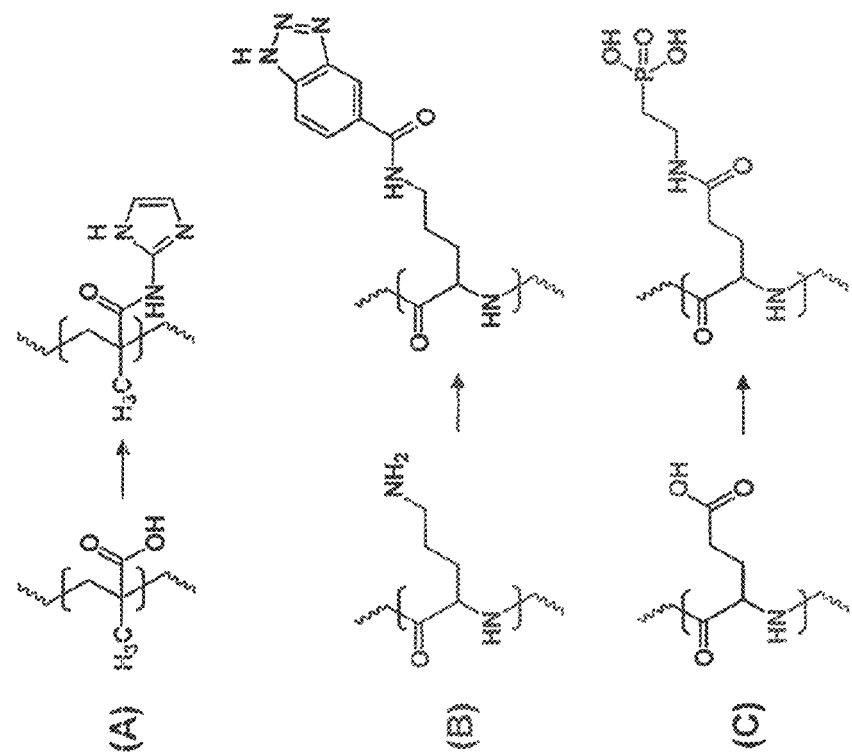

Polymers whose repeating units comprise such functional groups are already known. For example, polymers incorporating proton donor/acceptor groups include poly-L-histidine, poly(1-vinyl-1,2,4-triazole), poly(4-vinyl-1H-1,2,3-triazole), poly(5-vinyl tetrazole), poly(vinyl phosphonic acid), poly(1-methylvinyl phosphonic acid), poly(1,3-phenylene-5-phosphonic acid), poly(vinyl alcohol), poly(vinyl phenol), dextran (a polysaccharide), and tannic acid (a polyphenol); polymers incorporating acidic or basic groups include poly(acrylic acid), poly(styrene sulfonic acid), poly(ethyleneimine), and poly(allylamine); and polymers incorporating glycol ethers include poly(ethylene glycol) and poly(propylene glycol). These polymers are generally prepared by polymerizing monomeric units comprising the functional group, but the functional groups can also be introduced into pre-prepared polymers. Several representative examples of such reactions to attach proton donor/acceptor groups to polymers are shown in FIG. 9 (intermediate steps are omitted). Reactions A-C indicated in this figure involve condensation between carboxylic acid (—COOH) and amine (—NH$_2$) groups to form amide (—CONH—) bonds, reaction D involves a cycloaddition ("click") reaction between alkyne (—C≡C) and azide (—N$_3$) to form 1,2,3-triazole groups, and reaction E involves epoxide ring opening by an amine to attach a benzimidazole group, but other methods to form covalent bonds can also be used. Graphene oxide represents a different type of polymeric proton conducting material comprising sheets of carbon with several intrinsic kinds of proton donating/accepting functional groups, including carboxyl, hydroxyl, and epoxy groups.

Two important properties of the proton source (9) or proton sink (15) layers are (i) the layer thickness (d) and (ii) the proton donating (or accepting) capacity (PC). For the present purposes, we define the PC of a layer as milli-equivalents (meq) per cubic centimeter (cm$^3$), so that the units of the product d.PC are meq/cm$^2$. Thus, for example, in device A shown in FIG. 2a, where the proton source layer (9) is in contact with an equal area of the switching layer (2), in order to satisfy the condition that layer 9 has the proton donating capacity for switching to occur in layer 7, it is necessary that d.PC of layer 9 be equal to or greater than d·PC of layer 7. This relationship is only an approximation, however, since it neglects the possibility that protons may diffuse (within each layer) into or away from the regions defined by the junction; also switching in layer 7 may not require complete conversion of the oligoaniline molecules from EB to ES form. In order to satisfy the condition that layer 9 (or 1) be as thin as possible (so that the electric field will be as large as possible), it is desirable that its proton donating capacity be as large as possible, i.e. that the concentration within the layer of proton donor/acceptor groups (as well as acidic or basic groups, if present) is high (>1 M).

In one embodiment, the thickness of the proton source or sink layer (=thin film comprising a proton donating material or proton accepting material) is in the range from 1 nm to 10 µm, preferably 1 nm to 5 µm, more preferably 1 nm to 1 µm, even more preferably 1 nm to 500 nm.

In one embodiment, the thickness of the proton source or sink layer (=thin film comprising a proton donating material or proton accepting material) is in the range from 1 nm to 200 nm, preferably 1 nm to 100 nm.

Several methods for forming thin layers of polymeric proton conducting materials are possible. Two more-or-less independent processes are involved:
1) Formation of polymers comprising the functional groups involved in proton conduction from their precursors; and
2) Formation of thin films comprising these polymers or precursors thereof.

Examples of polymers that are formed either by polymerizing monomeric units comprising proton conducting functional groups or by covalent modification of polymers to introduce such functional groups were already considered above, so methods for forming thin films of these materials are now considered.

Methods to form thin films from solutions of polymers or polymer precursors include the spin-coating, dip-coating, drop-casting, Langmuir-Blodgett, and layer-by-layer (LbL) techniques. These methods can be used to prepare films of polymers with functional groups for proton conduction already attached, or films of polymers with functional groups that can subsequently be converted into groups for proton conduction, or films of non-polymeric compounds comprising groups for proton conduction that can subsequently polymerized. Polymeric materials are generally not volatile enough to be deposited by vacuum evaporation without decomposition, however vacuum evaporation can be used to form thin films of non-polymeric compounds comprising groups for proton conduction that are subsequently polymerized. Polymerization of films prepared by these methods can be achieved by, for example, thermally-induced condensation or ultraviolet light-induced radical polymerization reactions.

Of the above-mentioned methods to form films that function as the proton source (9) or proton sink (15) layers in these devices, the layer-by-layer (LbL) deposition technique has several advantageous features. These features include:
1) The method is applicable to polymeric as well as non-polymeric compounds, or combinations thereof;
2) The film thickness can be readily controlled, since it is mainly determined by the number of cycles used to deposit each layer comprising the final one;
3) Several kinds of complementary physical and/or chemical interactions may be used to deposit each layer comprising the final one; and
4) The LbL technique can be automated.

A film deposited using the LbL technique can be represented using the notation $S|L_A|L_B|L_A|L_B| \ldots$, where S represents the substrate, which may be an electrode, such as gate electrode 5, or another layer, such as switching layer 7, and $L_A$ and $L_B$ represent alternating layers of materials with complementary functional groups by which the two kinds of layers interact. Physical and/or chemical interactions between the alternating layers are important since they help keep the assembly together during intermediate rinsing steps used to remove excess materials. The layer deposition and rinsing steps can be performed in various ways including dip-coating, spin-coating, spray-coating, flow-based techniques and inkjet technology. The complementary interaction between functional groups that is most often used is electrostatic (e.g., between oppositely charged polyelectrolytes), but other reversible, non-covalent intermolecular interactions such as hydrogen bonding and host-guest-complex formation can also be employed. Alternatively, interaction between functional groups can involve covalent bond formation resulting in cross-linking of the layers, either during each deposition step or subsequently. Covalent cross-linking can provide greater chemical stability to LbL films compared to those using electrostatic or hydrogen-bonding interactions. Chemical reactions that can be used to cross-link LbL films include diverse reactions such condensations, cycloadditions, Michael additions, thiol-ene reactions, Schiff-base formation, and the formation of coordination complexes with metal ions. Many of the polymers mentioned above are suitable for forming proton conducting layers by the LbL technique because they comprise functional groups that can be positively or negatively charged (depending on pH), and/or can form hydrogen bonds, and/or are susceptible to condensation reactions, and/or that can form complexes with metal ions. Proteins, including enzymes, can be included into LbL films since they carry net electrostatic charges, which can be either positive or negative depending on whether the pH of the solution in which they are dissolved is below or above, respectively, the isoelectric point of the protein. The isoelectric point of carbonic anhydrase from human saliva, for example, is 6.4. Furthermore, the tendency of polyphenols to form complexes with enzymes (proteins) can be used as a complementary interaction for LbL film formation, for example where $L_A$ and $L_B$ represent layers of enzyme and polyphenol, or vice versa.

Special considerations are necessary when the proton conducting layer comprises a proton-generating enzyme (PGE, layer 21) or proton-consuming enzyme (PCE, layer 29). These considerations mainly involve the necessity to provide an environment in which the activity of the enzyme is maintained. Most enzymes exhibit activity within a limited pH range and have an optimal pH within that range. The enzyme carbonic anhydrase, for example, is active within a pH range of 5-10, with an optimal pH near 7. Therefore, the acidity and/or basicity of the functional groups of the proton conducting layer should preferably be selected so that it is sufficiently conductive while also providing a suitable pH environment for the enzyme. Imidazole and benzimidazole groups have $pK_a$ values of 7.2 and 5.7, respectively, and so should be suitable as a proton donor/acceptor groups in a layer whose pH is compatible with the carbonic anhydrase enzyme. Layers comprising a high density of hydroxyl groups also provide suitable media for most enzymes, since such media resemble aqueous environments. Layers comprising neutral polymers whose repeating units comprise hydroxyl groups, generally referred to as polyols or polyphenols, such as poly(vinyl alcohol), dextran (a polysaccharide), agarose (a polysaccharide), tannic acid (a polyphenol), or pentagalloylglucose (a polyphenol derived from tannic acid) can provide environments compatible with the carbonic anhydrase enzyme, as can layers comprising a combination of imidazole and hydroxyl groups. Enzymes, including carbonic anhydrase, and whole cells, such as bacteria, also remain active when immobilized within cross-linked polyurethane matrices formed by reaction between polyisocyanates and polyols (R. R. Koepsel, A. J. Russell (2003) Biomacromolecules 4, 850-855: "Direct capture of enzymes and bacteria on bioplastic films"; E. Ozdemir (2009) Energy Fuels 23, 5725-5730: "Biomimetic $CO_2$ sequestration: 1. Immobilization of carbonic anhydrase within polyurethane foams"). Besides physical entrapment, enzyme immobilization occurs as a result of covalent bond formation between functional groups on the surface of the enzyme and with the isocyanate groups (or products thereof). Polyurethanes are often formed from "prepolymers", which are reactive low-molecular-weight polymers or oligomers that are capable of further polymerization to a fully cured high molecular weight state. It is preferable to immobilize enzymes in films comprising polyurethane by mixing the enzyme with such prepolymers, to minimize exposure of the enzyme to harsh chemical conditions. An alternative method for forming urethane bonds that is mild enough for immobilization of enzymes involves the use of 1,1'-carbonyldiimidazole as condensing agent (G. T. Hermanson (1996) Bioconjugate Techniques, Academic Press, London, pp. 155, 183).

Enzyme-catalyzed reactions often accompanied by a change in pH as a result of production of anions which are the conjugate bases of acid, such as phenolate, carboxylate, or phosphate, or the production of cations which are the conjugate acids of bases, such as ammonium ions, or the production of neutral acidic species such as carbon dioxide or basic species such as ammonia. Various enzymes may be employed to provide for changes in pH. Examples of proton-generating enzymes (PGE), whose reactions generally cause the pH of the medium to decrease, include carbonic anhydrase, which catalyzes the hydration of $CO_2$ to generate carbonic acid, glucose oxidase, which catalyzes the oxidation of glucose to generate gluconic acid, cholinesterase, which catalyzes the hydrolysis of acetylcholine to generate acetic acid, and alkaline phosphatase which catalyzes the hydrolysis of phosphate esters to generate phosphate ion. Examples of proton-consuming enzymes (PCE), whose reactions generally cause the pH of the medium to increase, include urease, which catalyzes the hydrolysis of urea to generate ammonia, and allophanate hydrolase, which catalyzes the hydrolysis of allophanate to generate ammonia.

Figure 2A:
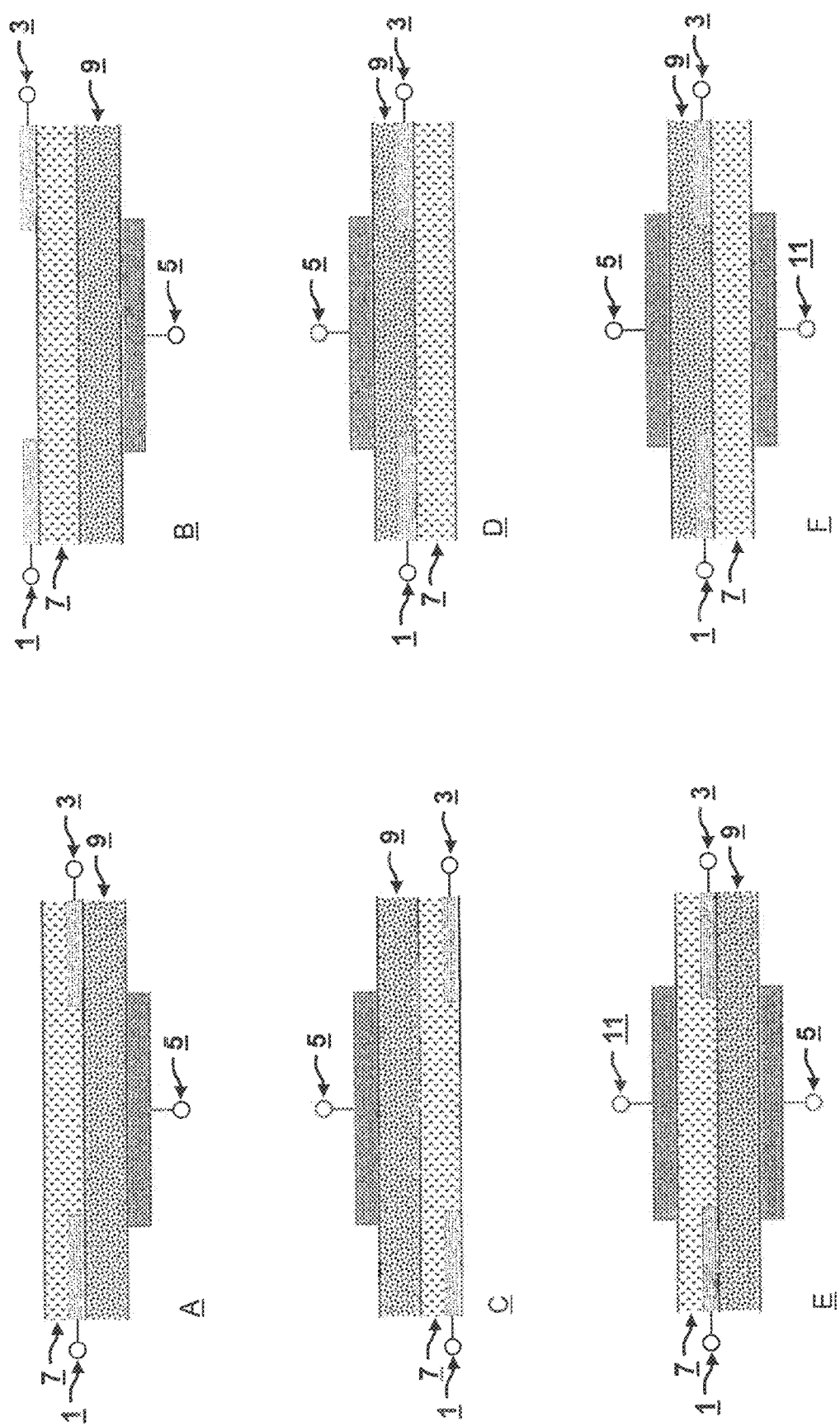
FIG. 2a shows configurations of field effect transistor devices.
Figure 2B:
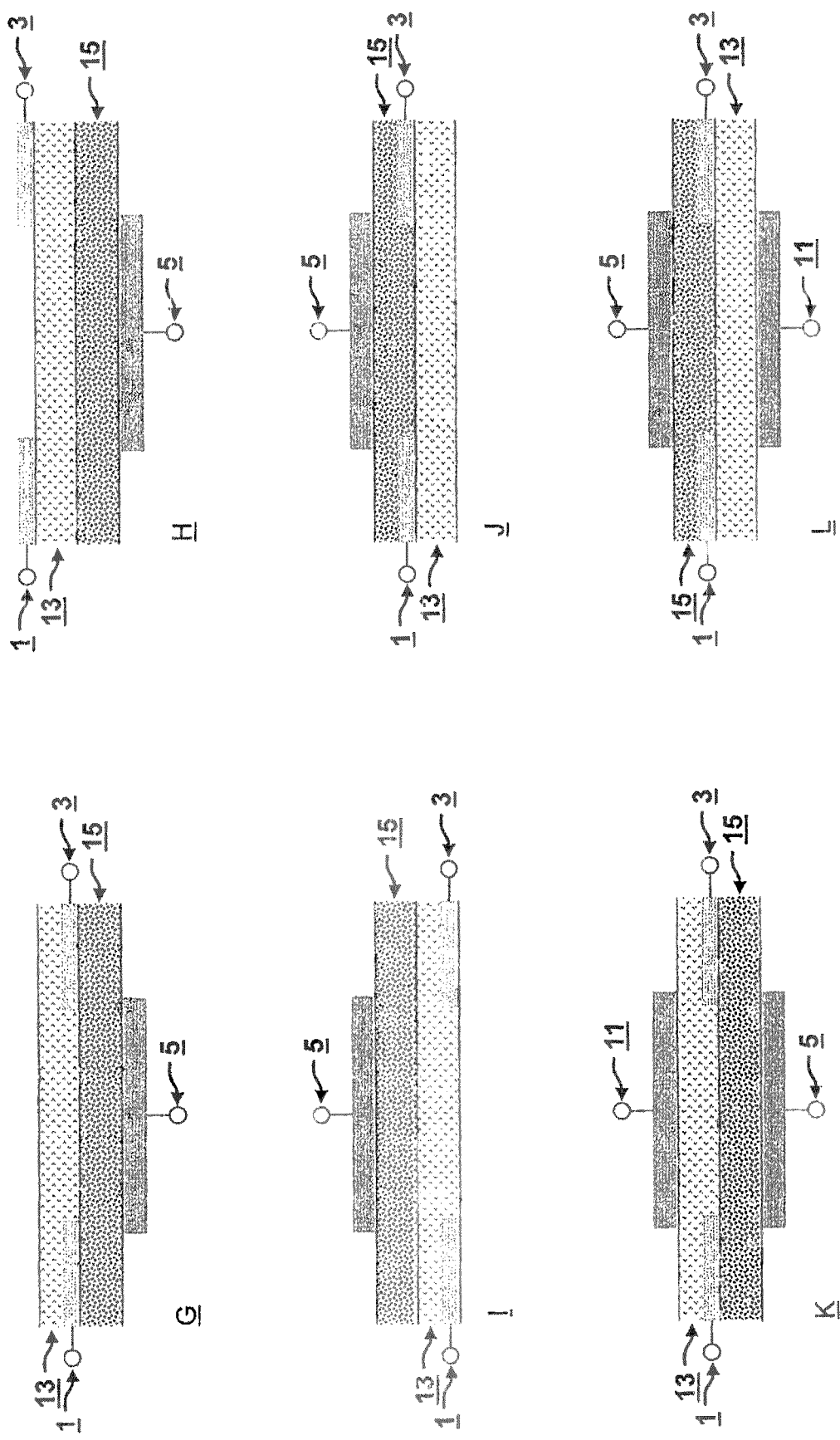
FIG. 2b shows devices comprising an emeraldine-salt form of an aniline oligomer is combined with a layer comprising a material that is sink for mobile protons.
Figure 2C:
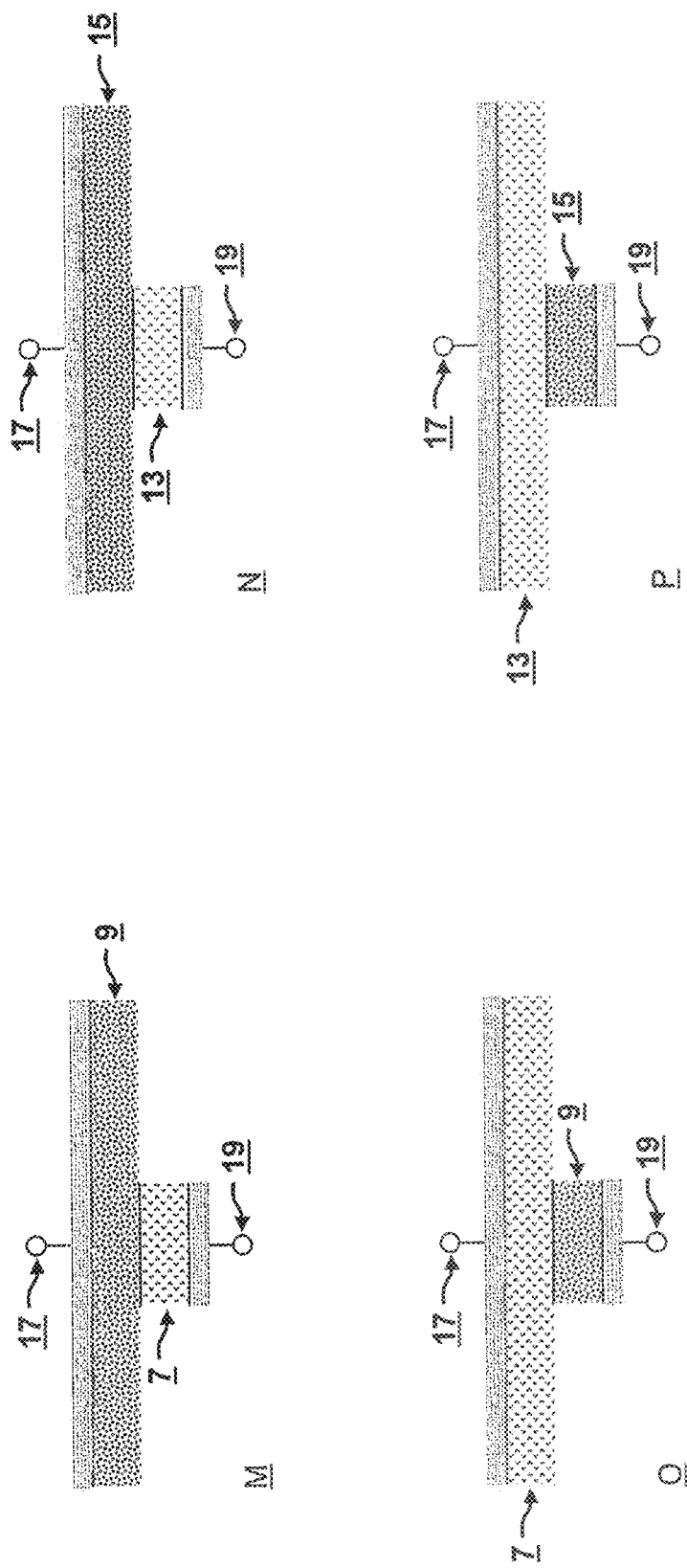
FIG. 2c shows crossbar (cross-point) switch memory devices.
Figure 2D:
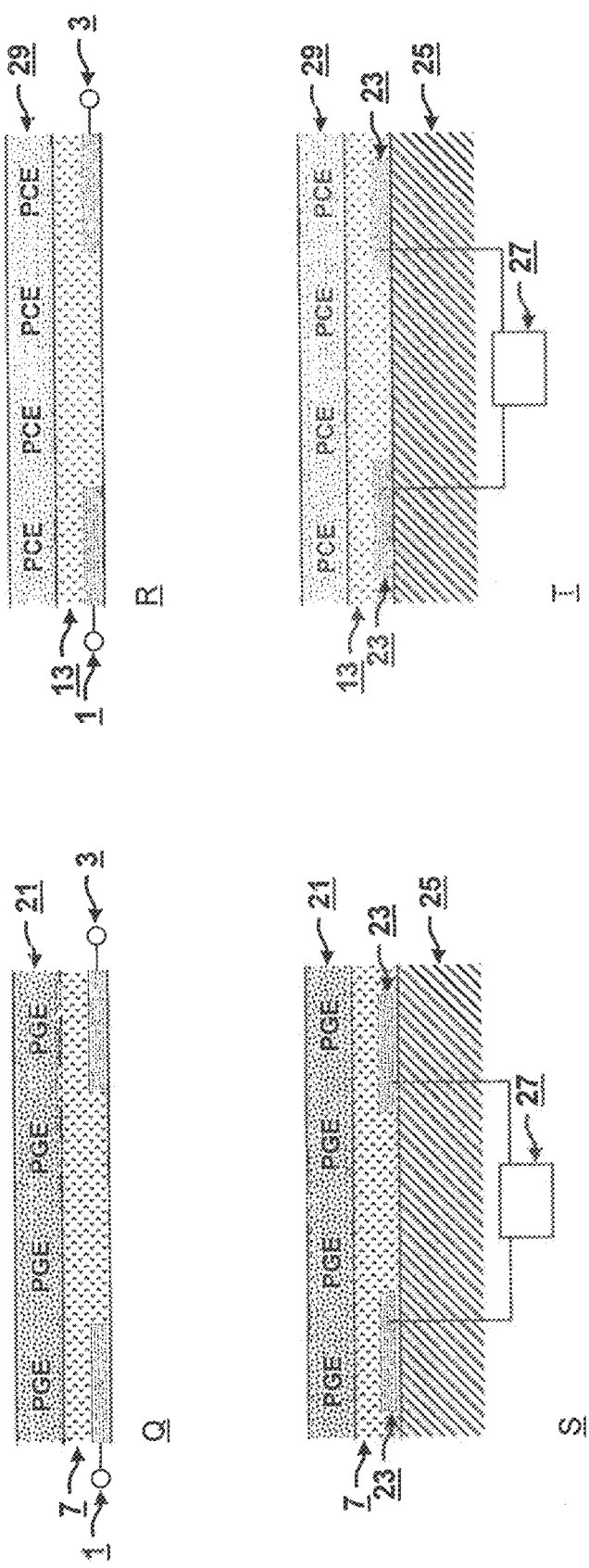
FIG. 2d shows chemiresistors with interdigitated electrodes and/or part of RFID tags.

In sensor devices such as illustrated in FIG. 2d, where layers 21 or 29 are used in RFID tags or surface-acoustic wave (SAW) transducers, layer thickness is not such a critical factor, and other methods for depositing the films besides LbL, such as dip-coating, spin-coating, or spray-coating may be more practical.

Furthermore, reference is made to the figures, wherein the following reference labels are used:
1: Drain electrode
3: Source electrode
5: Gate electrode
7: Switching layer comprising emeraldine base (EB) form of aniline oligomer
8: Dynamically doped segment of switching layer
9: Proton source (donating) layer
10: Partially depleted proton-source layer
11: Counter electrode
13: Switching layer comprising emeraldine salt (ES) form of aniline oligomer
15: Proton sink (accepting) layer
17: Top electrode
19: Bottom electrode
21: Proton source layer comprising proton-generating enzyme (PGE)
23: RFID antenna
25: Non-conducting (electrically insulating) substrate
27: RFID microchip
29: Proton sink layer comprising proton-consuming enzyme (PCE)
31: Electrode
33: Monolayer comprising aniline oligomer
35: Thin film comprising neat aniline oligomer
37: Thin film comprising aniline oligomer blended with a polymer
39: Template-stripped gold (bottom electrode, supported on glass)
41: Thin film comprising poly(vinyl alcohol)
43: Thin film comprising graphene oxide
45: Mercury drop (top electrode)

FIG. 1 illustrates the basic concept with an embodiment of a crossbar (cross-point) switch memory device and the aniline tetramer (tetraaniline) as examples.

In FIG. 2a, the diagrams A to F represent various configurations of field effect transistor devices wherein a layer comprising the emeraldine-base form of an aniline oligomer is combined with a layer comprising a material that is a source for mobile protons. The devices in diagrams A to D have three electrodes (drain, source and gate), while those in E and F also have a fourth electrode counter to the gate electrode, which may be grounded or biased at a constant voltage. In FIG. 2b, diagrams G to L represent devices that are analogous to those in A to F, wherein a layer comprising the emeraldine-salt form of an aniline oligomer is combined with a layer comprising a material that is sink for mobile protons.

In FIG. 2c, diagrams M to P represent crossbar (crosspoint) switch memory devices wherein either a layer comprising the emeraldine-base form of an aniline oligomer is combined with a layer comprising a proton donating material, or a layer comprising the emeraldine-salt form of an aniline oligomer is combined with a layer comprising a proton accepting material. These devices may also implement diodes.

In FIG. 2d, diagrams Q to T represent sensor devices, wherein either a layer containing the emeraldine-base form of tetraaniline (EB-TANI) is combined with a layer containing a proton generating enzyme in a hydrophilic matrix (for example blended with poly(vinyl alcohol)), or a layer containing the emeraldine-salt form of tetraaniline (ES-TANI) is combined with a layer containing a proton donating material (which may be blended with a hydrophilic matrix, e.g. poly(vinyl alcohol)). The sensor devices in diagrams Q and R are chemiresistors with interdigitated electrodes, while the sensors in S and T are part of RFID tags. Alternatively, the sensor devices in Q and R may be surface-acoustic-wave (SAW) transducers.

Figure 3:
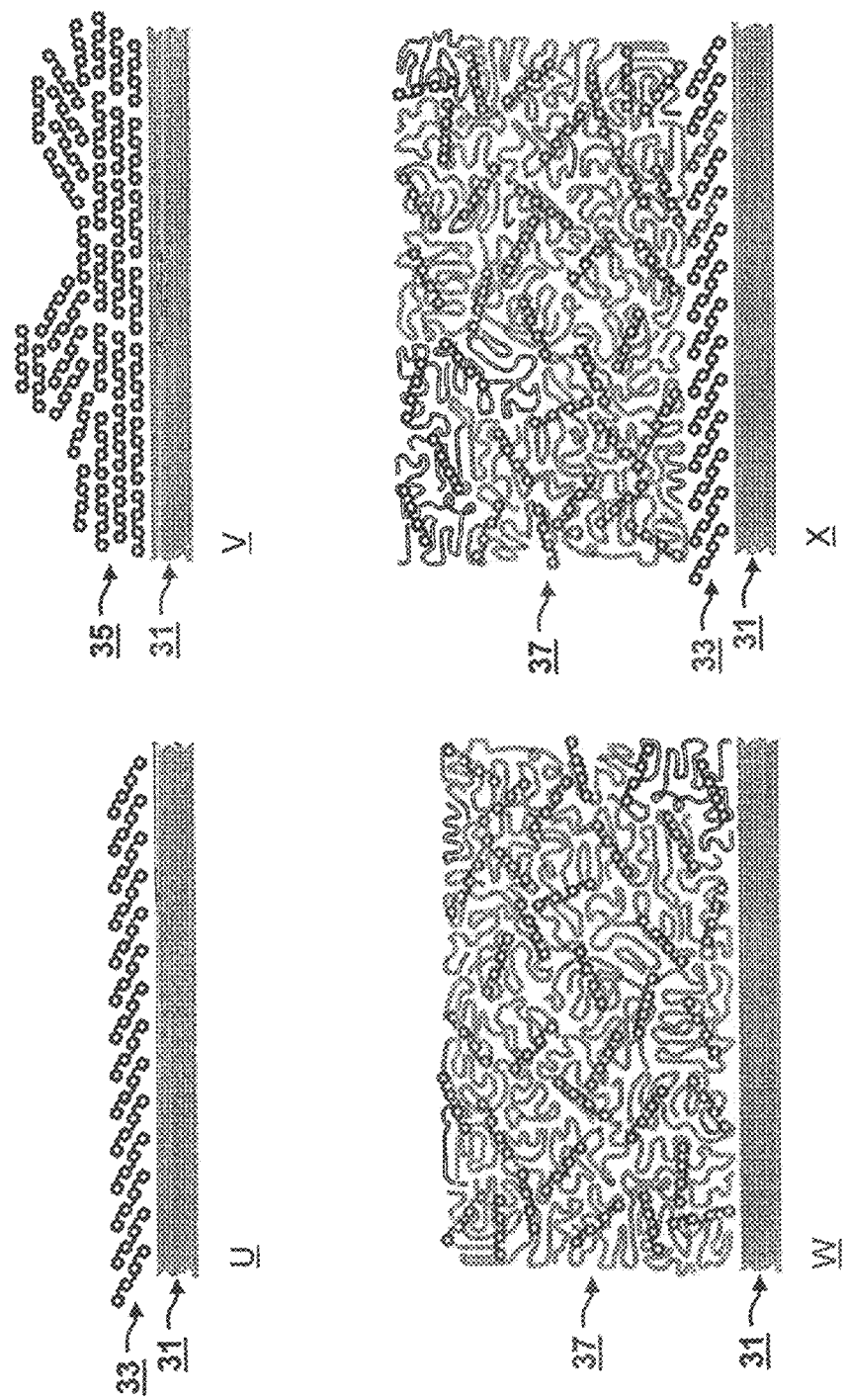
FIG. 3 shows thin films comprising aniline oligomers.

FIG. 3 shows examples of thin films ("layers" comprising aniline oligomers). The aniline oligomers may be arranged either as a monolayer or a multilayer. Alternatively, the aniline oligomers may be blended with a further polymer, or such blend may additionally be arranged on a monolayer of aniline oligomers.

Figure 4A:
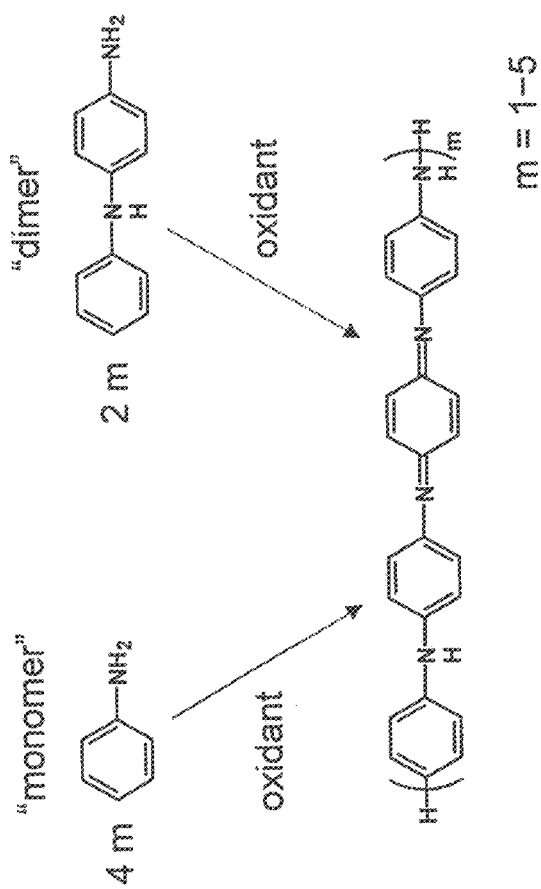
FIG. 4a shows the stepwise preparation of aniline oligomers of various lengths by joining shorter segments.
Figure 4B:
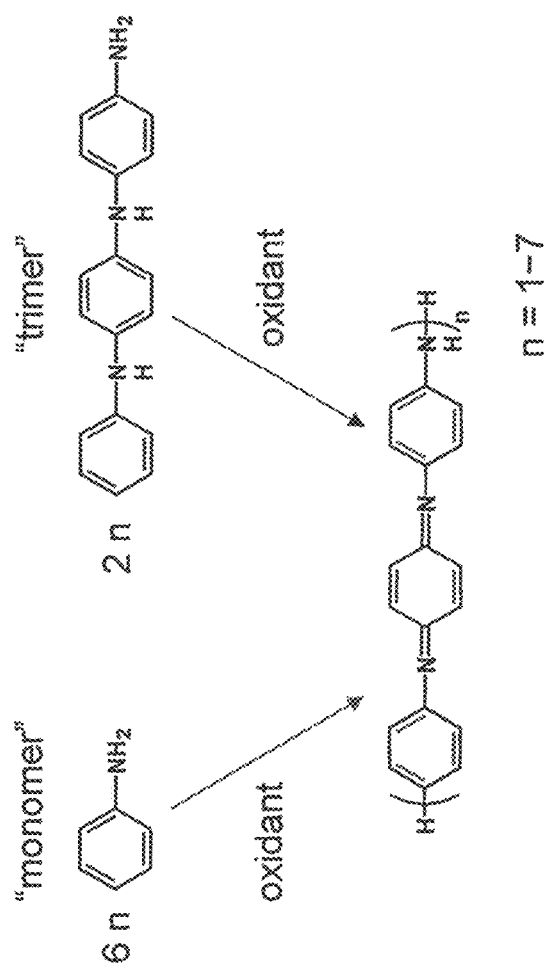
FIG. 4b shows the stepwise preparation of aniline oligomers of various lengths by joining shorter segments.

FIGS. 4a and 4b show the stepwise preparation of aniline oligomers of various lengths by joining shorter segments.

Figure 5:
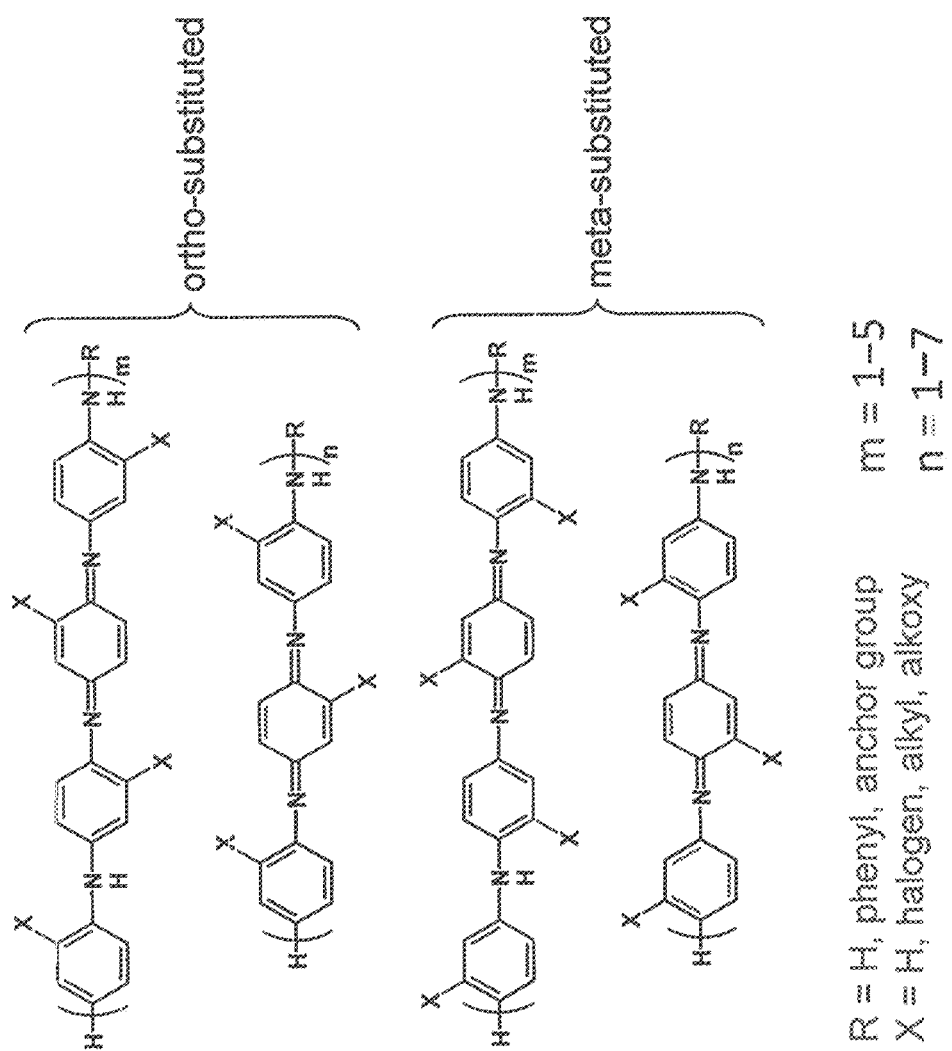
FIG. 5 shows derivatives of aniline oligomers.

FIG. 5 shows further possible derivatives of aniline oligomers, including derivatives terminated with a phenyl group, derivatives terminated with an anchor group, and derivatives with rings substituted in their ortho or meta positions.

Figure 6:
FIG. 6 shows examples of anchor groups as terminal groups for aniline oligomers for covalently attaching the oligomers to electrode surfaces.

FIG. 6 shows examples of anchor groups as terminal groups for aniline oligomers for covalently attaching the oligomers to electrode surfaces.

Figure 7:
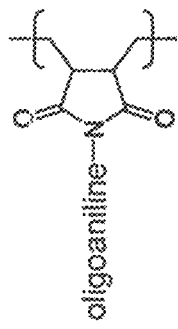
FIG. 7 shows examples of aniline oligomers which are covalently attached to polymers via the terminal amino (—NH$_2$) group of the oligomer and a reactive functional group of the polymer.
Figure 7:
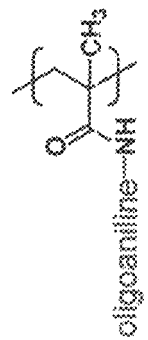
Figure 7:
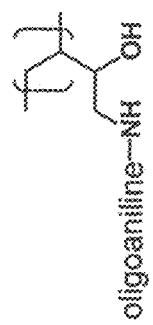
Figure 7:
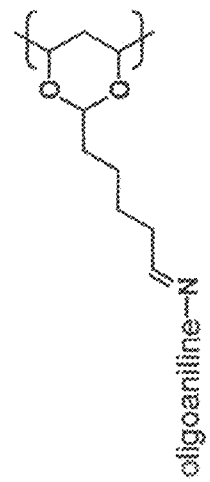

FIG. 7 shows examples of aniline oligomers which are covalently attached to polymers via the terminal amino (—NH$_2$) group of the oligomer and a reactive functional group of the polymer.

FIG. 8 shows examples of substituents comprising proton donor/acceptor groups using commercially available azoles.

FIG. 9 shows examples of proton donor/acceptor groups that have been covalently attached to pre-existing polymers.

Figure 10:
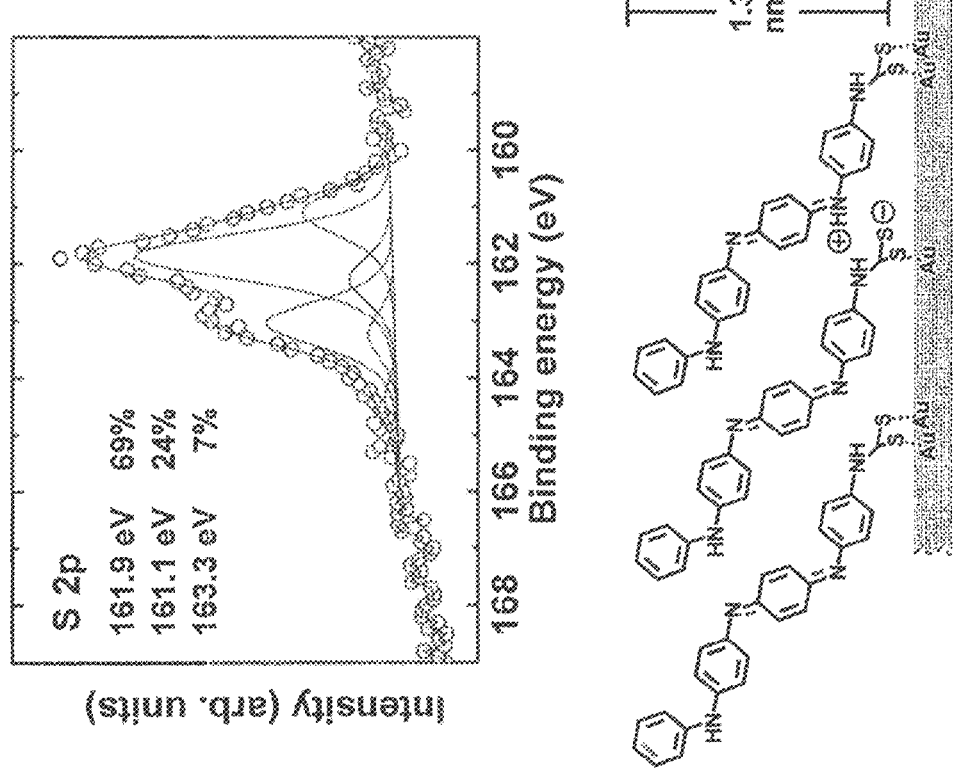
FIG. 10 shows the S 2p spectrum obtained by X-ray photoemission (XP) spectroscopy of the self-assembled monolayer of tetraaniline dithiocarbamate.

FIG. 10 shows the S 2p spectrum obtained by X-ray photoemission (XP) spectroscopy of the self-assembled monolayer of tetraaniline dithiocarbamate from Example 1 and a structural model for said monolayer.

Figure 11:
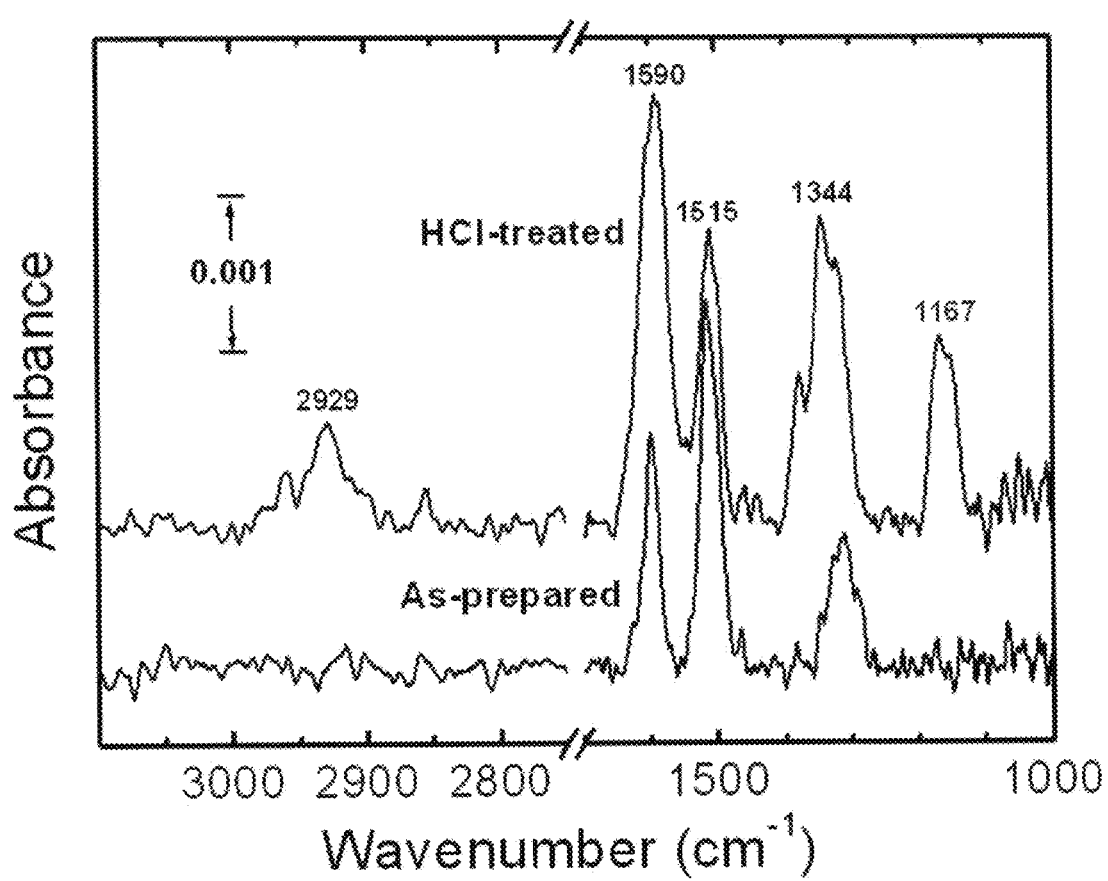
FIG. 11 shows infrared (IR) absorption spectra of the self-assembled monolayer of tetraaniline dithiocarbamate.

FIG. 11 shows infrared (IR) absorption spectra of the self-assembled monolayer of tetraaniline dithiocarbamate from Example 1, before (as-prepared, undoped) and after (doped) it is exposed to HCl vapour.

Figure 12:
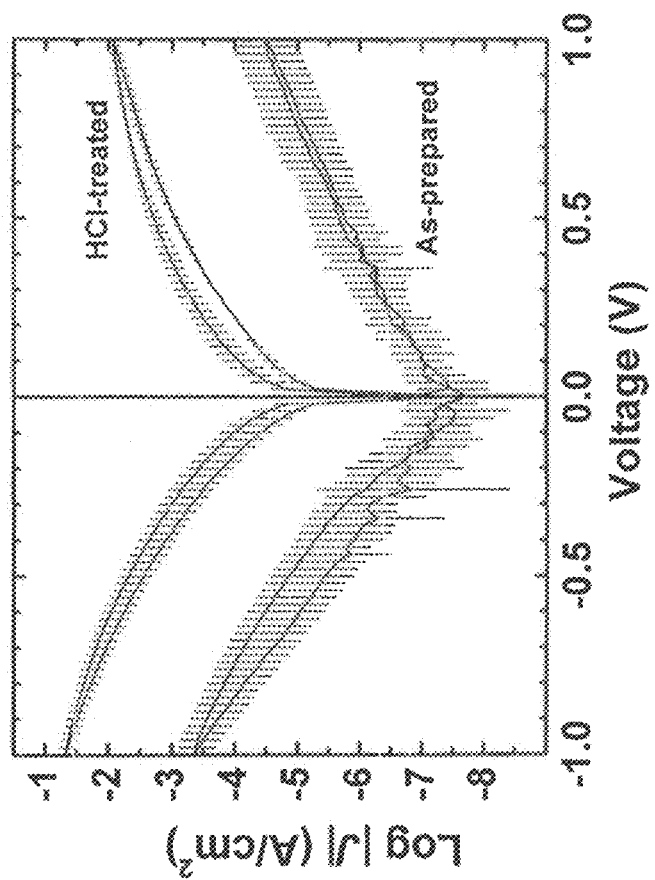
FIG. 12 shows current density versus voltage (J-V) curves obtained with self-assembled monolayers of tetraaniline dithiocarbamate.

FIG. 12 shows current density versus voltage (J-V) curves obtained with self-assembled monolayers of tetraaniline dithiocarbamate from Example 1, before (as-prepared, undoped) and after (doped) the samples are exposed to HCl vapour. The data are from several locations on several samples and the curves are the averages of these data (together with error bars).

Figure 13:
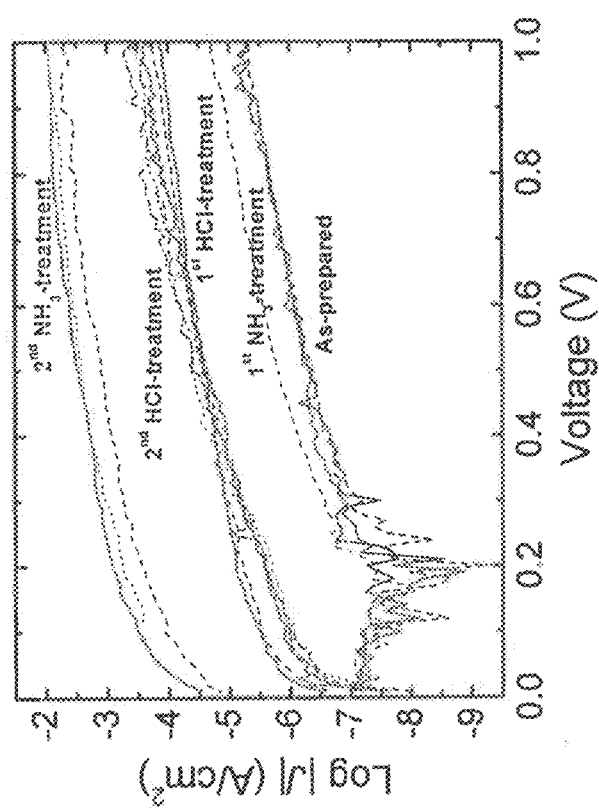
FIG. 13 shows J-V curves obtained with a self-assembled monolayer of tetraaniline dithiocarbamate.

FIG. 13 shows J-V curves obtained with a self-assembled monolayer of tetraaniline dithiocarbamate from Example 1, before (as-prepared, undoped) and after it is sequentially exposed to HCl vapour or to NH$_3$ vapour (with intermediate rinsing with solvents).

Figure 14:
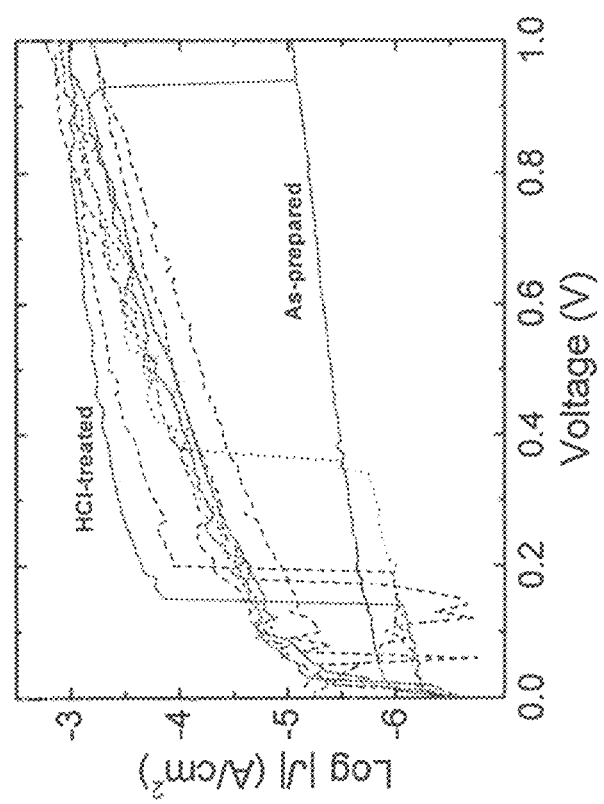
FIG. 14 shows J-V curves obtained with a self-assembled monolayer of tetraaniline dithiocarbamate.

FIG. 14 shows J-V curves obtained with a self-assembled monolayer of tetraaniline dithiocarbamate from Example 1, before (as-prepared, undoped) and after it is exposed to HCl vapour.

Figure 15:
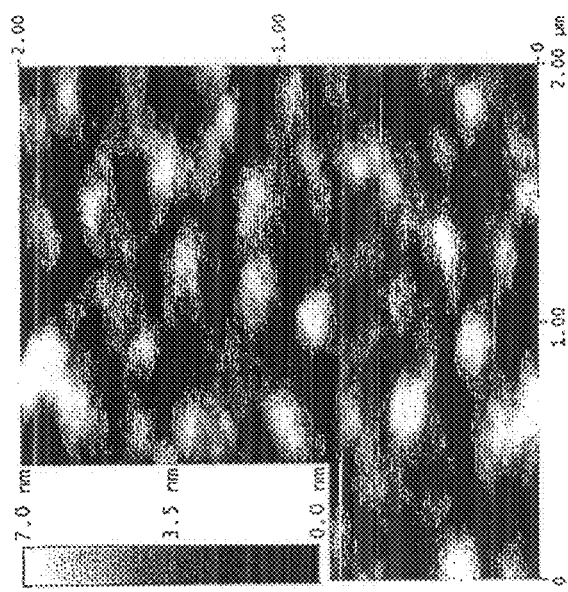
FIG. 15 is a topological image obtained by tapping mode atomic force microscopy (AFM) of the surface of a film of tetraaniline.

FIG. 15 is a topological image obtained by tapping mode atomic force microscopy (AFM) of the surface of a film of tetraaniline from Example 2.

Figure 16:
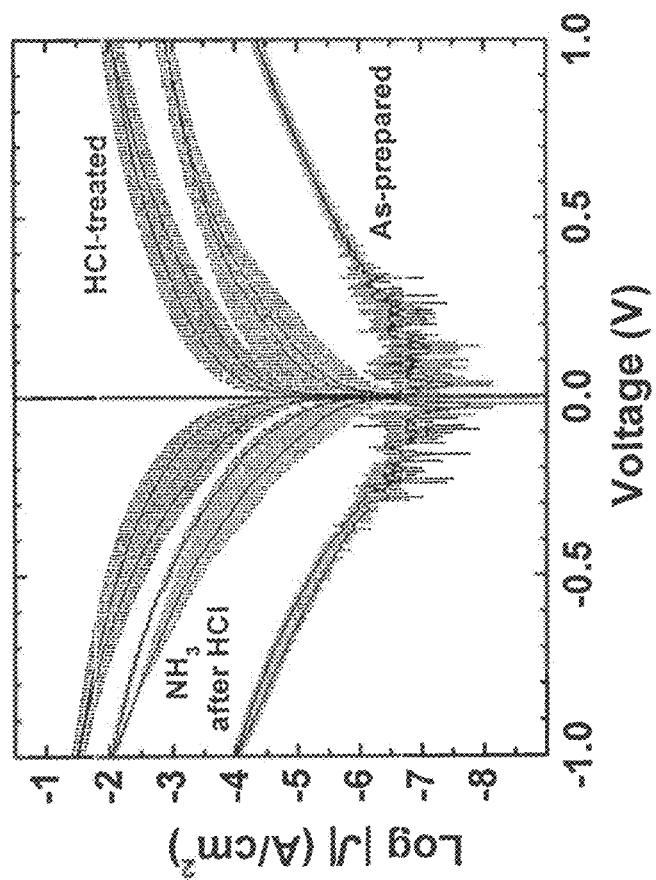
FIG. 16 shows J-V curves obtained with films of tetraaniline.

FIG. 16 shows J-V curves obtained with films of tetraaniline from Example 2, before (as-prepared, undoped) and after (doped) the samples are exposed to HCl vapour. The data are from several locations on several samples and the curves are the averages of these data.

Figure 17:
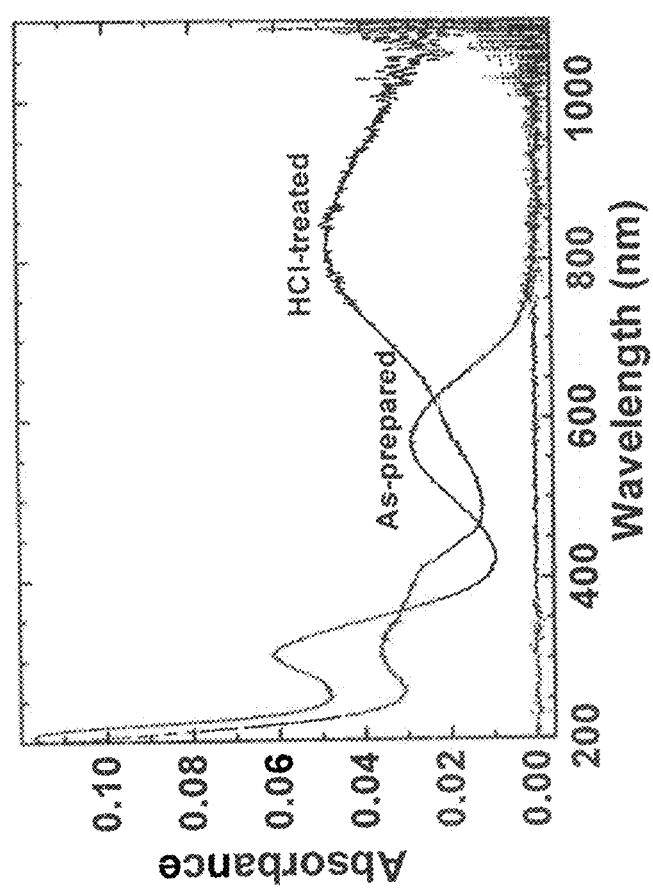
FIG. 17 shows ultraviolet-visible-near infrared (UV-visible-NIR) absorption spectra of a film of tetraaniline.

FIG. 17 shows ultraviolet-visible-near infrared (UV-visible-NIR) absorption spectra of a film of tetraaniline from Example 2, before (as-prepared, undoped) and after (doped) it is exposed to HCl vapour.

Figure 18:
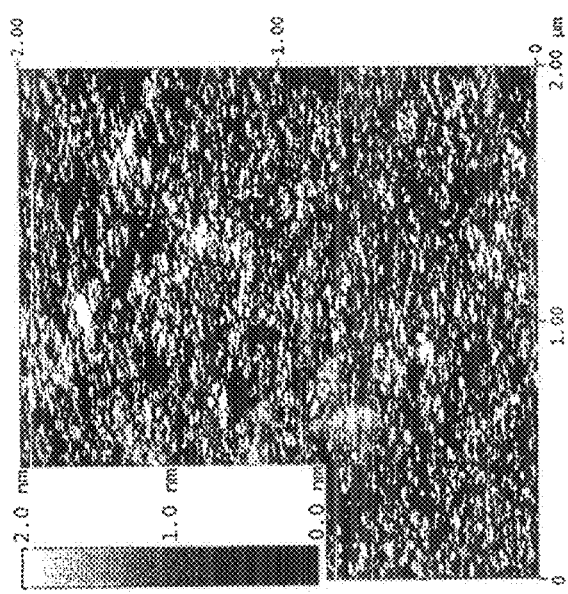
FIG. 18 is a topological image obtained by AFM of the surface of a film of tetraaniline-poly(methylmethacrylate) blend.

FIG. 18 is a topological image obtained by AFM of the surface of a film of tetraaniline-poly(methylmethacrylate) blend from Example 3.

Figure 19:
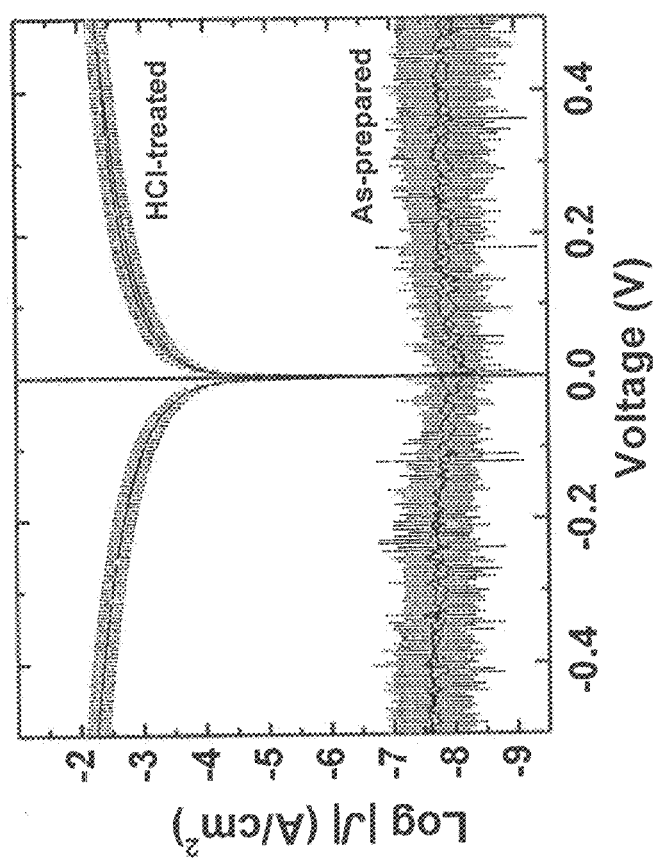
FIG. 19 shows J-V curves obtained with films of tetraaniline-poly(methylmethacrylate) blend

FIG. 19 shows J-V curves obtained with films of tetraaniline-poly(methylmethacrylate) blend from Example 3, before (as-prepared, undoped) and after (doped) the samples are exposed to HCl vapour. The data are from several locations on several samples and the curves are the averages of these data.

Figure 20:
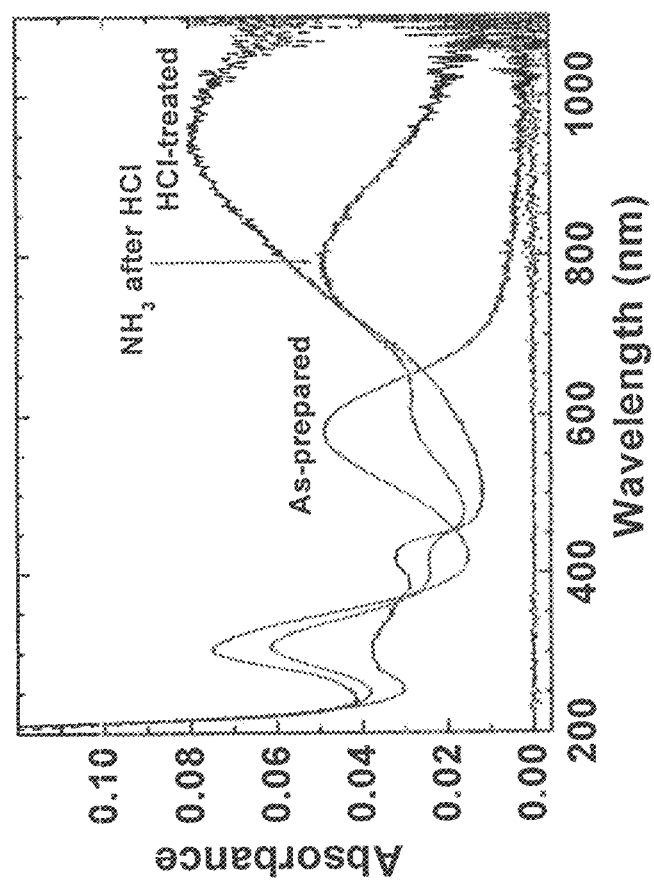
FIG. 20 shows UV-visible-NIR absorption spectra of a film of tetraaniline-poly(methylmethacrylate).

FIG. 20 shows UV-visible-NIR absorption spectra of a film of tetraaniline-poly(methylmethacrylate) blend from Example 3, before (as-prepared, undoped) and after (doped) it is exposed to HCl vapour.

Figure 21:
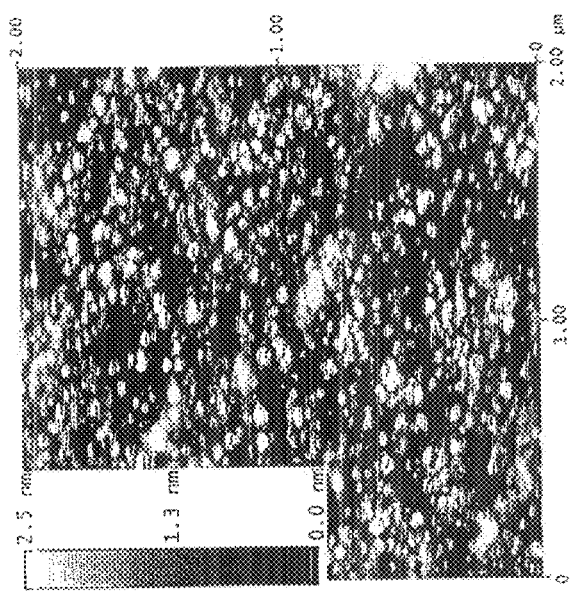
FIG. 21 is a topological image obtained by AFM of the surface of a film of tetraaniline-poly(methylmethacrylate-co-methacrylic acid) blend.

FIG. 21 is a topological image obtained by AFM of the surface of a film of tetraaniline-poly(methylmethacrylate-co-methacrylic acid) blend from Example 4.

Figure 22:
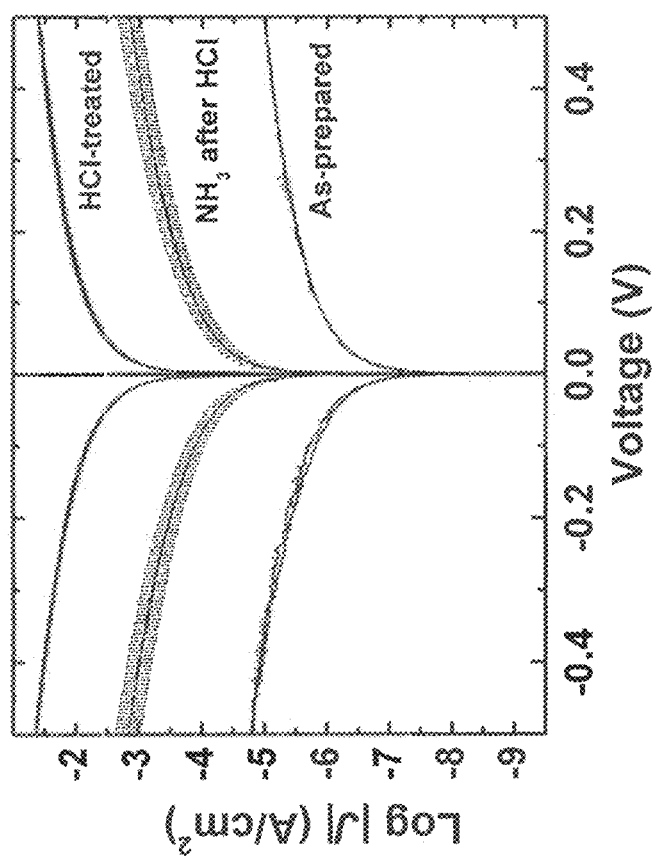
FIG. 22 shows J-V curves obtained with films of tetraaniline-poly(methylmethacrylate-co-methacrylic acid) blend.

FIG. 22 shows J-V curves obtained with films of tetraaniline-poly(methylmethacrylate-co-methacrylic acid) blend from Example 4, before (as-prepared, undoped) and after (doped) the samples are exposed to HCl vapour. The data are from several locations on several samples and the curves are the averages of these data.

Figure 23:
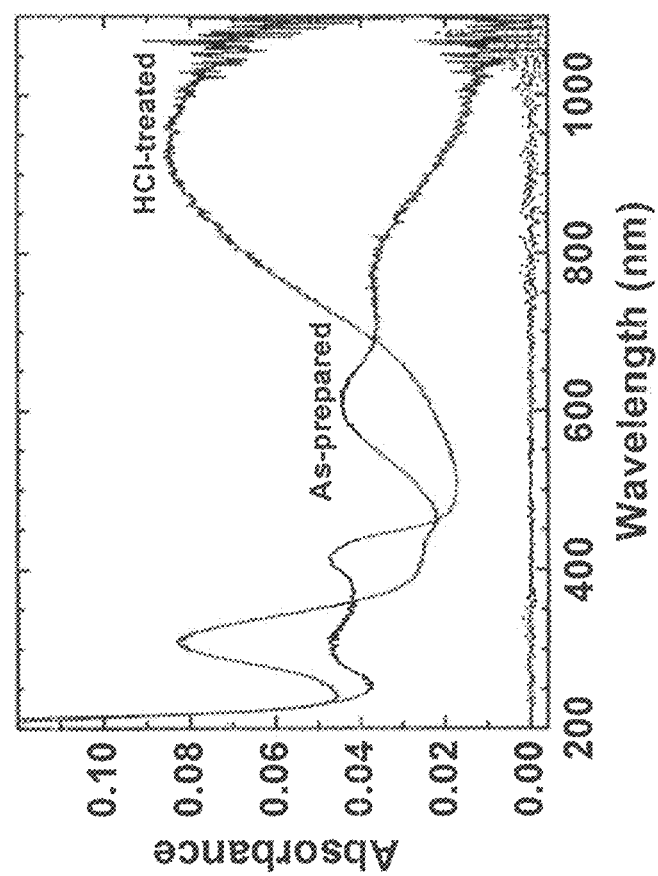
FIG. 23 shows UV-visible-NIR absorption spectra of a film of tetraaniline-poly(methylmethacrylate).

FIG. 23 shows UV-visible-NIR absorption spectra of a film of tetraaniline-poly(methylmethacrylate) blend from Example 3, before (as-prepared, undoped) and after (doped) it is exposed to HCl vapour.

Figure 24:
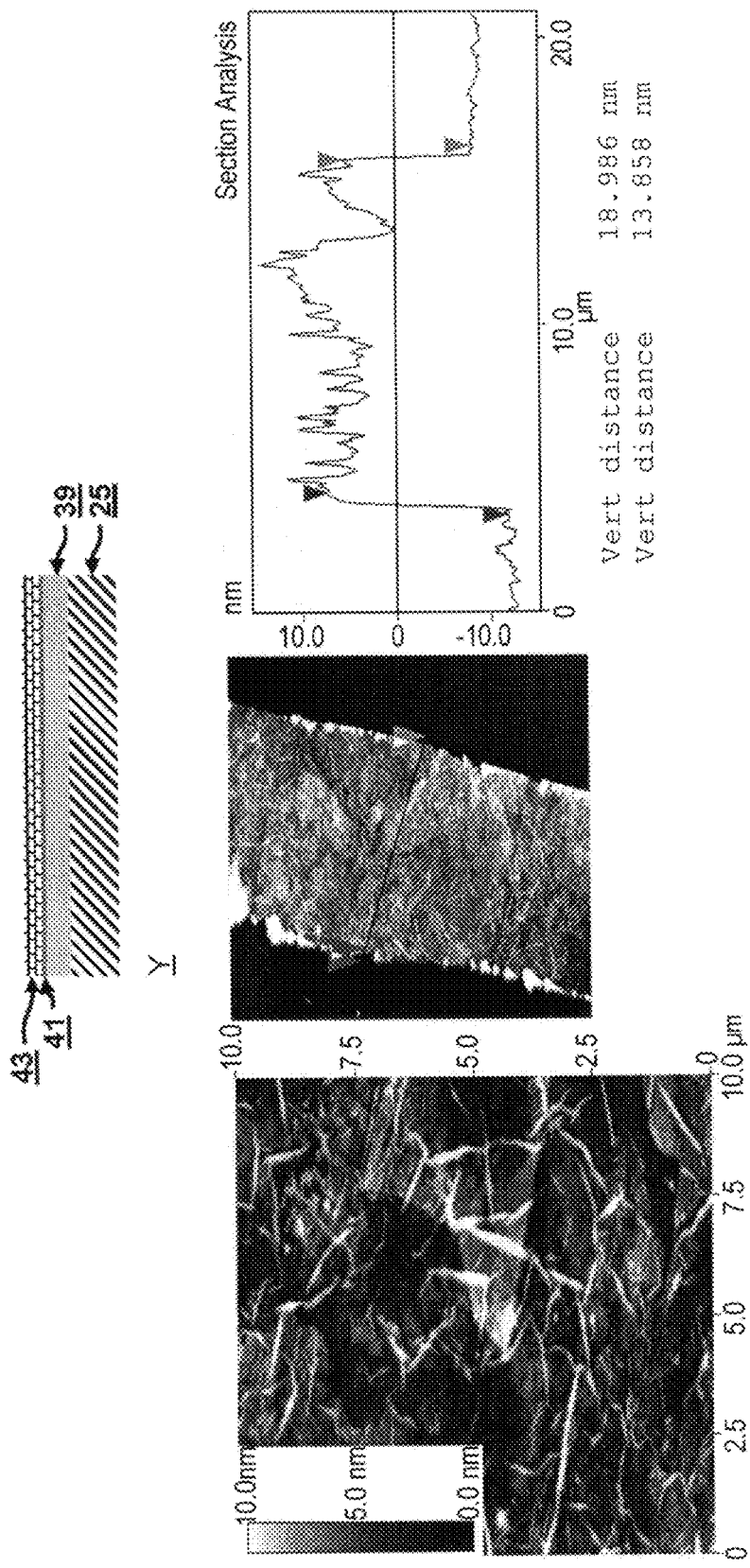
In FIG. 24, the diagram Y represents the substrate and first two layers of the switching device.

In FIG. 24, the diagram Y represents the substrate and first two layers of the switching device from Example 5, wherein the top layer comprising graphene oxide sheets comprise the source for mobile protons. Figures obtained by AFM of the structure indicated in the diagram are provided in the lower part of this figure.

Figure 25:
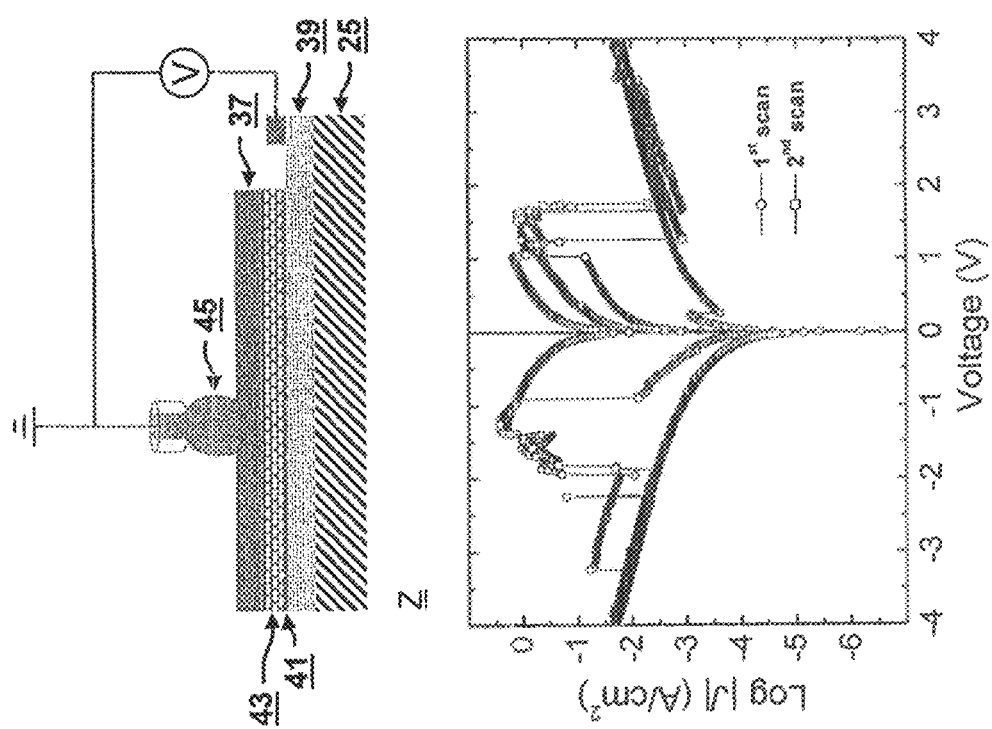
In FIG. 25, the diagram Z represents a switching device wherein the top electrode comprises a mercury drop. J-V FIG. 26 indicates the stepwise procedure for synthesizing a tetraaniline-piperazine-dithiocarbamate compound.

In FIG. 25, the diagram Z represents the switching device from Example 5, wherein the top electrode comprises a mercury drop. J-V curves obtained from this device indicating reversible switching of conductivity are provided in the lower part of this figure.

Figure 26:
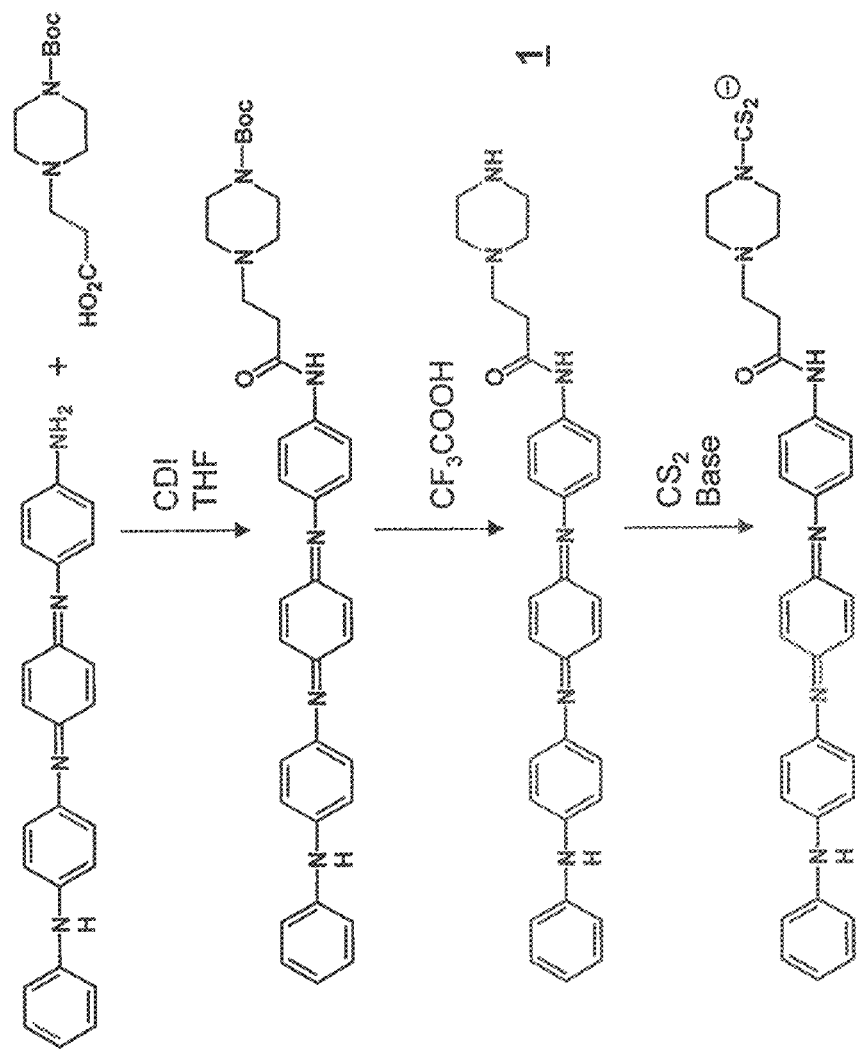

FIG. 26 indicates the stepwise procedure for synthesizing the tetraaniline-piperazine-dithiocarbamate compound in Example 6.

Figure 27:
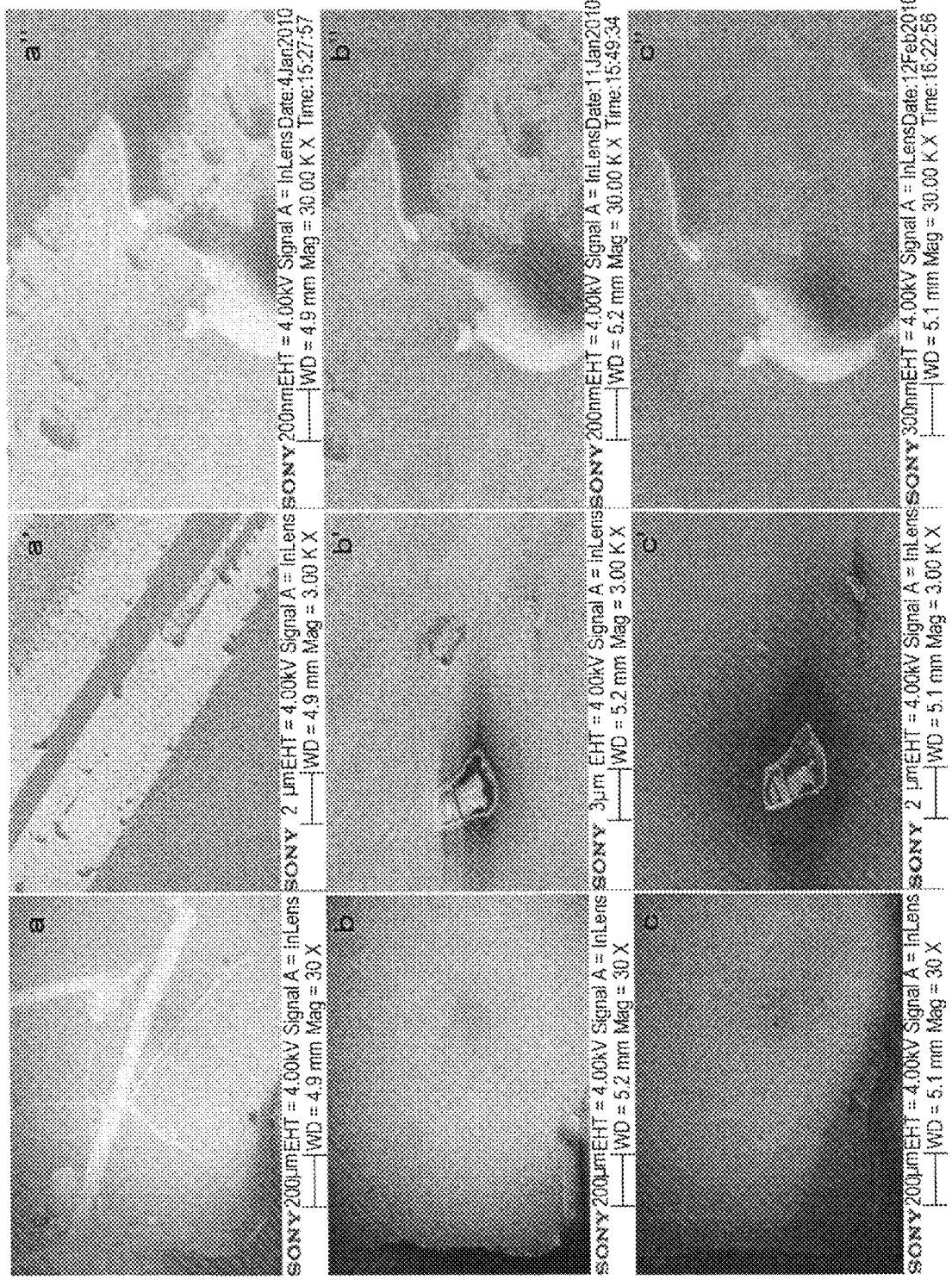
FIG. 27 shows images obtained by scanning electron microscopy (SEM) of the film obtained by self-assembly of a tetraaniline-piperazine-dithiocarbamate compound.

FIG. 27 shows images obtained by scanning electron microscopy (SEM) of the film obtained by self-assembly of the tetraaniline-piperazine-dithiocarbamate compound in Example 6 when the base is NaOH. The three images in the top row (a, a', and a") are obtained at three different magnifications (30×, 3000×, and 30000×, respectively). The bright lines are scratches in the film exposing the underlying gold substrate. The images in the second and third rows are obtained at these magnifications after the treatments described in Example 6.

The present disclosure provides materials, methods, and designs for electrical devices having various applications, including transistor devices, memory devices, and sensor devices, by using a combination of two or more "layers" or "thin films", one of which comprises aniline oligomers and another of which comprises proton donating or proton accepting materials.

Furthermore, reference is made to the following examples, which are given to illustrate, not to limit the present disclosure.

EXAMPLES

The following procedures specifically refer to the aniline tetramer (tetraaniline, TANI), but are applicable to other aniline oligomers as well.

Example 1

Switching Layer Comprising a Self-Assembled Monolayer of the Dithiocarbamate Derivative of Tetraaniline The emeraldine base of tetraaniline (TANI, MW 364.44), is synthesized by oxidation of N-phenyl-1,4-phenylenediamine with ferric chloride in 0.1 M HCl followed by neutralization with ammonium hydroxide according to a published procedure (B. Dufour, P. Rannou, J. P. Travers, A. Pron, M. Zagórska, G. Korc, I. Kulszewicz-Bajer, S. Quillard, S. Lefrant (2002) Macromol. 35, 6112-6120: "Spectroscopic and spectroelectrochemical properties of a poly(alkylthiophene)-oligoaniline hybrid polymer"). Anal. Calcd for $C_{24}H_{20}N_4$: C, 79.10; H, 5.53; N, 15.37. Found: C, 77.30, 77.60; H, 5.31, 5.51; N, 14.6, 14.3. Template-stripped gold (TSG) substrates with a RMS roughness of 0.3 nm are also prepared using a published procedure (R. Naumann, S. M. Schiller, F. Giess, B. Grohe, K. B. Hartman, I. Kärcher, I. Köper, J. Lübben, K. Vasilev, W. Knoll, W. (2003) Langmuir 19, 5435-5443: "Tethered lipid bilayers on ultraflat gold surfaces"). To a solution of TANI ($5.0 \times 10^{-4}$ M, 2.0 mL) is added a solution of triethylamine (0.050 M, 20.6 µL) and a solution of carbon disulfide (0.050 M, 20.6 µL).

The solvent in each case is ethanol. A freshly cleaved TSG substrate is then immersed into the solution for an assembly time of ~18-72 h. After assembly, the substrate is rinsed with ethanol and dried with a stream of nitrogen. FIG. 10 shows the XP spectrum of a monolayer of TANI-DTC in the S 2p region and a structural model for the monolayer consistent with the results (this model shows only one of several possible isomeric/tautomeric combinations). FIG. 11 shows IR absorption spectra of the monolayer before and after doping it with HCl; the observed spectral changes are in agreement with changes observed when films of polyaniline are converted from the EB to the ES state. FIG. 12 demonstrates acid-induced switching of the conductivity of the monolayer from an OFF state to an ON state as a result of doping of the as-prepared monolayer with HCl, which results in an increase in conductivity by a factor of 480 (averaged over the voltage range of ±1 V). FIG. 13 demonstrates reversible switching of conductivity of a SAM of TANI-DTC measured during the following sequence: i) as-prepared sample (2 scans), ii) after exposure to HCl vapour for 1 min (2 scans), iii) after exposure to $NH_3$ vapour for 1 min (2 scans), iv) after exposure to HCl vapour for 1 min (4 scans), and v) after exposure to $NH_3$ vapour for 1 min (3 scans). Doping of the as-prepared with HCl (i→ii) results in a 30-40-fold increase in current density, dedoping with $NH_3$ (ii→iii) nearly restores the original current density, and the second doping with HCl (iii→iv) nearly restores the condition obtained after the first doping step. unexpectedly, the second treatment with $NH_3$ (iv→v) results in a film whose current density is $\sim 10^3$ times greater than that of the as-prepared sample and similar in magnitude to that of the HCl-doped film in FIG. 12. It should be noted that J-V results shown in FIG. 13 are collected with a single sample using the mercury drop technique, wherein the sample is immersed in a hexadecane solution of hexadecanethiol (to coat the mercury electrode with a SAM of hexadecanethiol). Since hexadecane is non-volatile, it is removed from the sample between each doping/dedoping step by rinsing with iso-propanol. Also, rinsing with water is done after each treatment with $NH_3$ vapour to remove the $NH_4Cl$ that may form. The fact that the TANI-DTC SAM withstands such treatments without disintegrating attests to its robustness. Another demonstration of reversible switching of conductivity of a SAM of TANI-DTC is presented in FIG. 14. The current density of the as-prepared film is seen to abruptly increase by a factor of $\sim 10^2$ near a bias voltage of +0.93 V, indicating a transition to a more conductive ("ON") state. The second voltage sweep shows similar behaviour, except that the abrupt increase occurs near a bias voltage of +0.16 V. The plot also shows the results for three more sweeps after doping the film with HCl vapour. The conductivity state is initially low ("OFF" state) during each sweep, but abruptly increases by a factor of $\sim 10^2$ in each case, with different threshold voltages (near +0.14, +0.19, +0.37 V, respectively). The inventors believe that electric field induced dissociation of trace amounts of $H_2O$ may be involved in these phenomena. Although definitive explanations for the J-V characteristics exemplified by the results in FIGS. 13 and 14 require further investigations, the results presented herein clearly demonstrate that films comprising aniline oligomers as thin as single monolayers are capable of being switched reversibly between states of lower and higher electrical conductivity via protonic doping/dedoping events.

Example 2

Switching Layer Comprising a Thin Film of Neat Tetraaniline

A portion of the 0.005 M TANI in ethanol from Example 1 is applied to a substrate and spun at 2500 rpm for 90 sec. FIG. 15 is an image obtained by AFM of a spin-coated TANI film on a silicon substrate; the film has an root mean square (RMS) roughness of 1.53 nm and thickness of 14±3 nm. FIG. 16 demonstrates acid-induced switching of the conductivity of a spin-coated TANI film on a template-stripped gold substrate; doping of the as-prepared film with HCl results in an increase in conductivity by a factor of 790 (averaged over the voltage range of ±1 V). FIG. 17 provides UV-visible-NIR absorption spectral evidence for the HCl-induced switching of a spin-coated TANI film on a $CaF_2$ substrate; the spectral changes resulting from doping with HCl are in agreement with changes observed in films of polyaniline.

Example 3

Switching Layer Comprising a Thin Film of Tetraaniline-Poly(Methylmethacrylate) Blend Poly(methylmethacrylate) (PMMA, 12.32 mg, average MW 996,000) and 1-methoxy-2-propanol (1.33 mL) are mixed with occasional heating at 90° C. until the solid is completely dissolved to provide a 1 wt % (10 mg/mL) solution of PMMA. TANI (1.58 mg) and a portion of the PMMA solution (0.72 mL) are mixed until the solid is completely dissolved to provide a solution containing 0.006 M TANI and 1 wt % PMMA in 1-methoxy-2-propanol. A portion of this solution is applied to a substrate and spun at 2000 rpm for 90 sec to provide a TANI/PMMA film comprising 19 wt % TANI in a PMMA matrix. FIG. 18 is an AFM image of a spin-coated TANI/PMMA film on a silicon substrate; the film has an RMS roughness of 0.28 nm and thickness of 38.9±1.6 nm. FIG. 19 demonstrates acid-induced switching of the conductivity of a spin-coated TANI/PMMA film on a template-stripped gold substrate; doping of the as-prepared film with HCl results in an increase in conductivity by a factor of $1.3 \times 10^5$ (averaged over the voltage range of ±0.5 V). FIG. 20 provides UV-visible-NIR absorption spectral evidence for the HCl-induced switching of a spin-coated TANI/PMMA film on a $CaF_2$ substrate; the spectral changes resulting from doping with HCl are in agreement with changes observed in films of polyaniline.

Example 4

Switching Layer Comprising a Thin Film of Tetraaniline-Poly(Methylmethacrylate-Co-Methacrylic Acid) Blend A 1 wt % (10 mg/mL) solution of poly(methylmethacrylate-co-methacrylic acid) (P(MMA-MA, 33% MA) in 1-methoxy-2-propanol is a product of Allresist GmbH (AR-P 617.01). TANI (2.65 mg) and a portion of the P(MMA-MA) solution (1.2 mL) are mixed until the solid is completely dissolved to provide a solution containing 0.006 M TANI and 1 wt % P(MMA-MA) in 1-methoxy-2-propanol. A portion of this solution is applied to a substrate and spun at 3000 rpm for 90 sec to provide a TANI/P(MMA-MA) film comprising 19 wt % TANI in a P(MMA-MA) matrix. FIG. 21 is an AFM image of a spin-coated TANI/P(MMA-MA) film on a silicon substrate; the film has an RMS roughness of 0.22 nm and thickness of 36.8±0.7 nm. FIG. 22 demonstrates acid-induced switching of the conductivity of a spincoated TANI/P(MMA-MA) film on a template-stripped gold substrate; doping of the as-prepared film with HCl results in an increase in conductivity by a factor of $3.7 \times 10^3$ (averaged over the voltage range of ±0.5 V). FIG. 23 provides UV-visible-NIR absorption spectral evidence for the HCl-induced switching of a spin-coated TANI/P(MMA-MA) film on a $CaF_2$ substrate; the spectral changes resulting from doping with HCl are in agreement with changes observed in films of polyaniline. The presence of the shoulder around 800 nm indicates that there is a partial protonation (doping) of the TANI molecules by the carboxylic acid (—COOH) moieties of the methacrylic acid (MA) groups in the blend. Annealing the film at 80° C. for 20 min results in appreciable loss in intensity of the shoulder; this dedoping may be the result of a covalent condensation reaction between the —COOH groups of MA with the —$NH_2$ groups of TANI to form non-acidic amide (—CONH—) bonds between the TANI molecules and the polymer.

Example 5

Solid-State Assembly Comprising a Switching Layer and a Proton-Source Layer

This assembly comprises a stack of three layers deposited sequentially on a bottom electrode, which is then contacted with a top electrode. FIG. 24 provides a diagram (Y) and AFM results for the assembly after the first two layers are deposited. The assembly comprises template-stripped gold (39) supported on glass (25) as the bottom electrode, a monolayer of poly(vinyl alcohol) (41) adsorbed to the gold surface, and a layer of graphene oxide (also known as graphite oxide) (43) deposited on 41. Layer 41 is used to obtain a more uniform layer 43; the inventors have observed that layer 43 deposited onto 39 with 41 is considerably smoother and uniform in thickness than without 41. It can be speculated that hydrogen bonding between —OH of the poly(vinyl alcohol) and similarly polar groups of the graphene oxide are responsible for this effect. Layer 41 may also function as a thin (~1-2 nm) insulator to enhance the electric field within layer 43. Layer 41 is prepared according to a published procedure (M. Kozlov, M. Quarmyne, W. Chen, T. J. McCarthy (2003) Macromol. 36, 6054-6059: "Adsorption of poly(vinyl alcohol) onto hydrophobic substrates. A general approach for hydrophilizing and chemically activating surfaces"). Thus, layer 41 is deposited by applying a 4 wt % (40 mg/mL) solution of poly(vinyl alcohol) (98% hydrolyzed, MW ~13,000-23,000, Aldrich #348406) in water to a freshly cleaved template-stripped gold substrate for 3 min, then rinsing the substrate with water and drying it with a stream of nitrogen. Layer 43 is then deposited by applying a 0.0092 wt % (0.092 mg/mL) dispersion of graphene oxide (Graphene Supermarket, single layer dispersion in water, concentration 275 mg/mL, diluted with two parts pure water) and allowing the solvent to evaporate undisturbed under ambient conditions. The resulting film is roughly circular with a distinct rim and central zone, but these regions comprise only about 20% of the total area. AFM images of layer 43 obtained in the field between the outer and inner zones show graphene oxide sheets lying parallel to the surface and overlaying one another, with a RMS roughness of 2.8 nm (mainly due to wrinkles and/or folds in the sheets) and a average thickness of 12±5 nm (FIG. 24). Layer 43 functions as a proton source. It is known that acidic polar oxygen groups are present around the edges of graphene oxide sheets; the empirical formula for graphene oxide is $C_8O_2(OH)_2$, so that 162 grams of graphene oxide has the capacity to provide approximately 2 moles of protons. Therefore 1 $cm^2$ of layer 43 with thickness ~12 nm ($1.2 \times 10^{-6}$ cm) and density ~1.5 $g/cm^3$ has a proton capacity of ~$1 \times 10^{-8}$ moles. This quantity can be compared to the quantity required to protonate the TANI molecules comprising the switching layer 37 in contact with layer 43 (FIG. 25, diagram Z). Layer 37 is deposited onto 43 by spin-coating a solution comprising 0.006 M TANI and 1 wt % PMMA in 1-methoxy-2-propanol, as described in Example 3. A 1 $cm^2$ section of layer 37 with thickness ~39 nm ($3.9 \times 10^6$ cm), density ~1 $g/cm^3$ and 19 wt % TANI (MW 364) contains ~$2 \times 10^{-9}$ moles of TANI (emeraldine base). Since the conversion of TANI from the EB form to ES form requires 2 protons per molecule, the quantity required for the 1 $cm^2$ section is ~$4 \times 10^{-9}$ moles, i.e., the quantity of exchangeable protons available in layer 43 is ~2-3 times greater than the quantity required for switching layer 37 from the OFF to the ON state. These results demonstrate electric field induced switching in a layered assembly comprising a layer of graphene oxide (43) and a layer of a blend of tetraaniline with poly(methylmethacrylate) sandwiched between gold and mercury electrodes. This behaviour is not observed in assemblies wherein layers 41 and 43 are absent.

Example 6

Switching Layer Comprising a Self-Assembled Film of a Tetraaniline-Piperazine-Dithiocarbamate Compound This dithiocarbamate compound and its precursor, whose structures and synthesis routes are indicated in FIG. 26, have not been previously disclosed. Like TANI-DTC described in Example 1, this compound comprises an the emeraldine base form of an aniline oligomer (tetraaniline) as switching component and a dithiocarbamate moiety as anchoring group, but it includes an intermediate segment comprising a piperazine ring, which is covalently attached to the tetraaniline by an amide bond. The main function of the piperazine ring is to provide a secondary amino (>NH) group as a site for conversion into the dithiocarbamate ($>NCS_2^-$), but the ring may also help the molecules self-organize at the electrode surface. The synthesis of the parent piperazine-terminated compound 1 is accomplished in two steps: 1) the condensation reaction between the —COOH group of 3-(1-tert-butoxycarbonylpiperazin-4-yl)propionic acid the —$NH_2$ group of TANI to form the amide (—CONH—) bond, using N,N'-carbonyldiimidazole (CDI) as condensation reagent, and 2) removal of the tert-butoxycarbonyl (Boc) group, using trifluoroacetic acid (TFA) as catalyst. These two reactions are achieved with yields of 60-70%. The dithiocarbamate derivative of compound 1 and its self-assembly onto gold substrates is achieved using a procedure analogous to the one described in Example 1, except that N,N-dimethylformamide (DMF) is used as the solvent for compound 1 instead of ethanol, and two different bases are used, either triethylamine (as in Example 1) or sodium hydroxide (NaOH), to prepare two different samples. The assembly process with either base is allowed to proceed for 2.7 days, after which the substrates are rinsed with ethanol and dried with a stream of argon. XP spectra of the samples show S 2p peaks at 162 eV, as expected for sulphur atoms of the dithiocarbamate bound to gold, but the relatively weak signal intensities indicate that the films thicker than a single monolayer. The composition of the film obtained with triethylamine as base corresponds to the empirical formula $C_{30.6}N_{6.0}O_{1.2}S_{0.2}$ (excluding H-atoms, which are not detected by the XP spectrometer), which is close to that of compound 1, $C_{32}H_{31}N_6O$. Thus it can be concluded that the film is likely to comprise a monolayer of the dithiocarbamate with an overlaying layer of compound 1. Based on the N/Au ratio, the total film thickness is estimated to be equivalent to 7 molecular layers. Similarly, the composition of the film obtained with NaOH as base corresponds to the empirical formula $C_{32.5}N_{6.0}O_{0.9}S_{0.6}$, and, based on the N/Au ratio, the total film thickness is estimated to be equivalent to 3 molecular layers. These findings are supported by AFM measurements, which indicate thicknesses of 5.5±1.1 nm and 4.3±1.1 nm for the films obtained with triethylamine and NaOH as base, respectively. FIG. 27 is a collection of six SEM images obtained before and after treatment of the film obtained with NaOH as base. The three images in the top row (a, a', and a") are obtained at three different magnifications (30×, 3000×, and 30000×, respectively). The bright lines are scratches in the film exposing the underlying gold substrate. The images in the second row (b, b', and b") are obtained after immersing the sample in a bath of DMF for 5 min, then rinsing it with ethanol and drying it with a stream of air, in order to remove the molecules that are not covalently attached to the gold surface. A film is apparent only in regions where the SEM images were made before the treatment with DMF. The inventors conclude that the molecules comprising the film in those regions are cross-linked by the electron beam of the instrument, rendering them insoluble in DMF. The defect seen in b' that was absent in a' is apparently a tear in the gold film that occurred during the treatment with DMF. The images in the third row (c, c', and c") are obtained after depositing a film of TANI on the DMF-treated sample according the method described in Example 2.

The invention claimed is:

1. An electric solid-state device, comprising:
  a first thin film, a second thin film, a first electrode and a second electrode,
  wherein the first thin film comprises aniline oligomers wherein said aniline oligomers are aniline n-mers, wherein n is in the range from n=1 to n=21 and the aniline oligomers are covalently attached to a surface of at least one of the first and the second electrodes through an anchoring group,
  the second thin film comprises a proton donating material or a proton accepting material, wherein said first and second thin films are arranged in a stacked manner.

2. The electric solid-state device according to claim 1, wherein said aniline oligomers are in the emeraldine base (EB) form.

3. The electric solid-state device according to claim 1, wherein said aniline n-mers are oligomers comprising aniline monomers in which
  a) a hydrogen atom in an ortho-position with respect to the amine group of said aniline monomer,
  and/or
  b) a hydrogen atom in a meta-position with respect to the amine group of said aniline monomer, is replaced by another atom or group of atoms,
  and/or in which
  c) one or both of the hydrogen atoms attached to a terminal nitrogen atom of said aniline oligomers is/are replaced by another atom or group of atoms, or by the anchoring group.

4. The electric solid-state device according to claim 1, wherein said first thin film comprising said aniline oligomers has a thickness in the range of from 1 nm to 500 nm.

5. The electric solid-state device according to claim 1, wherein said second thin film comprising a proton donating material or a proton accepting material has a thickness in the range of from 1 nm to 500 nm.

6. The electric solid-state device according to claim 1, wherein said proton donating material is an acidic material comprising one or several functional groups having at least one $pK_a$ value in an aqueous medium in the range of from −1 to 7; or said proton donating material is a blend of at least one of said acidic materials with non-acidic materials; or said proton donating material is a layer-by-layer assembly of at least one of said acidic materials with non-acidic materials.

7. The electric solid-state device according to claim 6, wherein said proton donating material is a polymer or a blend of several polymers, and said functional groups form part of a backbone or of sidechain(s) of said polymer(s).

8. The electric solid-state device according to claim 1, wherein said proton accepting material is a basic material comprising one or several functional groups having at least one $pK_a$-value in an aqueous medium in the range of from 2 to 10; or said proton accepting material is a blend of at least one of said basic materials with non-basic materials; or said proton accepting material is a layer-by-layer-assembly of at least one of said basic materials with non-basic materials.

9. The electric solid-state device according to claim 8, wherein said proton donating material is a polymer or a blend of several polymers, and said functional groups form part of a backbone or of sidechain(s) of said polymer(s).

10. The electric solid-state device according to claim 1, wherein said proton donating material or proton accepting material is combined with a material comprising one or more functional groups having pKa values in an aqueous medium that are outside the range of from −1 to 10.

11. The electric solid-state device according to claim 10, wherein said proton donating material is a polymer or a blend of several polymers, and said functional groups form part of a backbone or of sidechain(s) of said polymer(s).

12. The electric solid-state device according to claim 1, wherein said device additionally comprises an electrically insulating substrate.

13. The electric solid-state device according to claim 1, which is a field effect transistor, a memory device or a sensor.

14. The electric solid-state device according to claim 13, which is
a) a field effect transistor, comprising:
 a drain electrode and a source electrode in contact with said first thin film comprising aniline oligomers, and a gate electrode being in contact with said second thin film comprising a proton donating material or a proton accepting material or being at an interface between said first thin film comprising aniline oligomers and said second thin film comprising proton donating or proton accepting material,
 said first thin film comprising aniline oligomers being in contact with said second thin film comprising a proton donating or proton accepting material and thus forming said interface, and, said field effect transistor
 optionally, comprising a counter electrode located opposite said gate electrode and being in contact with said first thin film comprising aniline oligomers,
or said device is
b) a memory device comprising:
 a top electrode in contact with one of the first and the second thin film of said assembly of layers, and
 a bottom electrode in contact with an opposite thin film of said assembly of layers, wherein said one thin film is said first thin film comprising aniline oligomers and said opposite thin film is said second thin film comprising a proton donating or proton accepting material, said first and the second thin films being in contact with each other,
or said device is
c) a sensor device comprising
 a source electrode and a drain electrode in contact with said first thin film comprising aniline oligomers, and
 wherein said second thin film comprising a proton donating or proton accepting material is a thin film comprising a proton generating enzyme or a proton consuming enzyme, wherein said second thin film comprising said proton generating enzyme or said proton consuming enzyme is in contact with said first thin film comprising aniline oligomers,
or said device is
d) a sensor device, comprising
 a radio frequency antenna in contact with said first thin film comprising aniline oligomers and wherein said second thin film comprising a proton donating or proton accepting material is a thin film comprising a proton generating enzyme or a proton consuming enzyme, wherein said second thin film comprising said proton generating enzyme or said proton consuming enzyme is in contact with said first thin film comprising aniline oligomers.

15. An electric solid-state device, comprising:
a solid-state assembly of layers, comprising:
a first thin film, a second thin film, a first electrode and a second electrode,
wherein the first thin film comprises a polymer and aniline oligomers, wherein said aniline oligomers are aniline n-mers wherein n is in the range from n=1 to n=21, and the aniline oligomers are in direct contact with a surface of at least one of the first and the second electrodes,
wherein the polymer is covalently attached to the aniline oligomers, and
the second thin film comprises a proton donating material or a proton accepting material,
wherein said first and said second thin films are arranged in a stacked manner and the polymer is not polyaniline.

16. The electric solid-state device according to claim 15, wherein the aniline oligomers are in the emeraldine salt form.

17. The electric solid-state device according to claim 15, wherein the aniline oligomers are in the emeraldine base form.

18. The electric solid-state device according to claim 15, wherein n is in the range of from n=2 to n=7.

19. The electric solid-state device according to claim 15, wherein n is in the range of from n=2 to n=6.

20. The electric solid-state device according to claim 15, wherein n is in the range of from n=2 to n=4.

21. The electric solid-state device according to claim 1, wherein n is in the range of from n=2 to n=6.

22. The electric solid-state device according to claim 1, wherein n is in the range of from n=2 to n=5.

23. The electric solid-state device according to claim 1, wherein n is in the range of from n=2 to n=7.

24. The electric solid-state device according to claim 1, wherein the anchoring group is selected from the group consisting of a dithiocarbamate group, a thiol group, a phosphonic acid group, a carboxylic acid group, and a silanol group.

25. The electric solid-state device according to claim 1, wherein the anchoring group is a dithiocarbamate group.

26. The electric solid-state device according to claim 1, wherein said aniline oligomers are in the emeraldine salt (ES) form.

27. The electric solid-state device according to claim 1, wherein the aniline oligomers consist of atoms of hydrogen, nitrogen, carbon and optionally a halogen.

28. The electric solid-state device according to claim 1, wherein the aniline oligomers consist of atoms of hydrogen, carbon, nitrogen and optionally a halogen, and the aniline oligomers are covalently bonded to the surface of the electrode through an anchoring group consisting of atoms of elements selected from the group consisting of hydrogen, carbon, nitrogen, oxygen, sulfur and silicon.

29. The electric solid-state device according to claim 11, wherein the aniline oligomers consist of atoms of hydrogen, nitrogen, carbon and optionally a halogen.

30. The electric solid-state device according to claim 15, wherein the aniline oligomers consist of atoms of hydrogen, carbon, nitrogen and optionally a halogen, and the aniline oligomers are covalently bonded to the surface of the electrode through an anchoring group consisting of atoms of elements selected from the group consisting of hydrogen, carbon, nitrogen, oxygen, sulfur and silicon.

* * * * *

UNITED STATES PATENT AND TRADEMARK OFFICE
CERTIFICATE OF CORRECTION

PATENT NO. : 9,299,932 B2
APPLICATION NO. : 13/725055
DATED : March 29, 2016
INVENTOR(S) : William Ford et al.

It is certified that error appears in the above-identified patent and that said Letters Patent is hereby corrected as shown below:

On the title page, Item (72), the 4th Inventor's First Name is incorrect. Item (72) should read:

--(72) Inventors: William Ford, Stuttgart (DE);
 Deqing Gao, Stuttgart (DE);
 Florian Von Wrochem, Stuttgart (DE);
 Gabriele Nelles, Stuttgart (DE)--

Signed and Sealed this
Fourteenth Day of June, 2016

Michelle K. Lee
*Director of the United States Patent and Trademark Office*